United States Patent
Atanackovic

(10) Patent No.: US 11,629,401 B1
(45) Date of Patent: Apr. 18, 2023

(54) METHOD FOR HEATING A WIDE BANDGAP SUBSTRATE BY PROVIDING A RESISTIVE HEATING ELEMENT WHICH EMITS RADIATIVE HEAT IN A MID-INFRARED BAND

(71) Applicant: Silanna UV Technologies Pte Ltd, Singapore (SG)

(72) Inventor: Petar Atanackovic, Henley Beach South (AU)

(73) Assignee: Silanna UV Technologies Pte Ltd, Singapore (SG)

( * ) Notice: Subject to any disclaimer, the term of this patent is extended or adjusted under 35 U.S.C. 154(b) by 0 days.

(21) Appl. No.: 17/661,389

(22) Filed: Apr. 29, 2022

Related U.S. Application Data

(63) Continuation of application No. PCT/IB2021/059945, filed on Oct. 27, 2021.

(51) Int. Cl.
  *C30B 23/06* (2006.01)
  *C23C 14/54* (2006.01)
  (Continued)

(52) U.S. Cl.
  CPC ............ *C23C 14/541* (2013.01); *C23C 14/08* (2013.01); *C23C 14/50* (2013.01); *C30B 23/025* (2013.01);
  (Continued)

(58) Field of Classification Search
  CPC ....... C30B 23/00; C30B 23/02; C30B 23/025; C30B 23/06; C30B 23/063; C30B 25/00;
  (Continued)

(56) References Cited

U.S. PATENT DOCUMENTS 4,421,479 A   12/1983   Muka et al.
5,625,202 A    4/1997   Chai
(Continued)

FOREIGN PATENT DOCUMENTS

JP    3531865 B2     5/2004
WO    2004074556 A2  9/2004
WO    2011090963 A2  7/2011

OTHER PUBLICATIONS

Elaheh Ahmadi et al., 'Schottky barrier height of Ni to β-(AlxGa1-x)2O3 with different compositions grown by plasma assisted molecular beam epitaxy', Semicond. Sci. Technol. 32 (2017) 035004 (5pp), Jan. 30, 2017 pp. 1-5. (https://iopscience.iop.org/article/10.1088/1361-6641/aa53a7).

(Continued)

*Primary Examiner* — Kenneth A Bratland, Jr.
(74) *Attorney, Agent, or Firm* — MLO, a professional corp.

(57) ABSTRACT

Methods and systems of heating a substrate in a vacuum deposition process include a resistive heater having a resistive heating element. Radiative heat emitted from the resistive heating element has a wavelength in a mid-infrared band from 5 μm to 40 μm that corresponds to a phonon absorption band of the substrate. The substrate comprises a wide bandgap semiconducting material and has an uncoated surface and a deposition surface opposite the uncoated surface. The resistive heater and the substrate are positioned in a vacuum deposition chamber. The uncoated surface of the substrate is spaced apart from and faces the resistive heater. The uncoated surface of the substrate is directly heated by absorbing the radiative heat.

10 Claims, 25 Drawing Sheets

(51) Int. Cl.

| | | |
|---|---|---|
| *H05B 3/14* | (2006.01) | |
| *G05D 23/19* | (2006.01) | |
| *H05B 1/02* | (2006.01) | |
| *G01J 5/00* | (2022.01) | |
| *G01J 5/0802* | (2022.01) | |
| *H01J 37/32* | (2006.01) | |
| *C30B 23/02* | (2006.01) | |
| *C30B 29/16* | (2006.01) | |
| *C23C 14/08* | (2006.01) | |
| *C23C 14/50* | (2006.01) | |

(52) U.S. Cl.
CPC ............ *C30B 23/063* (2013.01); *C30B 29/16* (2013.01); *G01J 5/0007* (2013.01); *G01J 5/0802* (2022.01); *G05D 23/1928* (2013.01); *H01J 37/32724* (2013.01); *H05B 1/0233* (2013.01); *H05B 3/141* (2013.01); *H05B 2203/005* (2013.01)

(58) Field of Classification Search
CPC ....... C30B 25/02; C30B 25/10; C30B 25/105; C30B 25/18; C30B 29/00; C30B 29/10; C30B 29/16; C30B 29/22; C30B 29/36; C23C 14/08; C23C 14/50; C23C 14/54; C23C 14/541; G01J 5/0802; G01J 5/0007; G05D 23/1928; H01J 37/32724; H05B 1/0233; H05B 3/141; H05B 2203/005
USPC ..... 117/84–86, 88, 103, 106, 108, 200, 204, 117/937, 944–947, 950–951
See application file for complete search history.

(56) References Cited

U.S. PATENT DOCUMENTS

| | | | |
|---|---|---|---|
| 5,879,811 | A | 3/1999 | Tanaka et al. |
| 6,146,550 | A * | 11/2000 | Le Boulch ............. H05B 3/148 252/516 |
| 6,236,076 | B1 | 5/2001 | Arita et al. |
| 6,492,191 | B2 | 12/2002 | Shibata et al. |
| 6,914,268 | B2 | 7/2005 | Shei et al. |
| 6,977,397 | B2 | 12/2005 | Ichinose et al. |
| 7,359,415 | B1 | 4/2008 | Alfano et al. |
| 7,393,411 | B2 | 7/2008 | Ichinose et al. |
| 7,727,865 | B2 | 6/2010 | Ichinose et al. |
| 8,617,965 | B1 | 12/2013 | Quick et al. |
| 9,105,473 | B2 | 8/2015 | Ueda et al. |
| 9,548,678 | B2 | 1/2017 | Schuh et al. |
| 10,636,916 | B2 | 4/2020 | Shih et al. |
| 11,175,447 | B1 | 11/2021 | Pynn et al. |
| 2001/0011743 | A1 | 8/2001 | Arita et al. |
| 2002/0189534 | A1 | 12/2002 | Tang et al. |
| 2005/0122005 | A1 | 6/2005 | Higuchi et al. |
| 2005/0223983 | A1 | 10/2005 | Selvamanickam et al. |
| 2006/0150891 | A1 | 7/2006 | Ichinose et al. |
| 2007/0166967 | A1 | 7/2007 | Ichinose et al. |
| 2008/0008964 | A1 | 1/2008 | Chan et al. |
| 2008/0083905 | A1 | 4/2008 | Alfano et al. |
| 2008/0233671 | A1 | 9/2008 | Chou et al. |
| 2009/0137099 | A1 | 5/2009 | Schonherr et al. |
| 2010/0078626 | A1 | 4/2010 | Orita et al. |
| 2010/0117118 | A1 | 5/2010 | Dabiran et al. |
| 2010/0140642 | A1 | 6/2010 | Arai et al. |
| 2012/0091548 | A1 | 4/2012 | Sukegawa et al. |
| 2012/0112158 | A1 | 5/2012 | Chyan et al. |
| 2012/0244684 | A1 * | 9/2012 | Suzuki .................... C30B 25/10 118/724 |
| 2012/0280224 | A1 | 11/2012 | Doolittle et al. |
| 2012/0306834 | A1 | 12/2012 | Ueda et al. |
| 2013/0233240 | A1 | 9/2013 | Cody et al. |
| 2014/0331919 | A1 | 11/2014 | Sasaki |
| 2015/0001467 | A1 | 1/2015 | Cho et al. |
| 2015/0171222 | A1 | 6/2015 | Sasagawa et al. |
| 2015/0179445 | A1 | 6/2015 | Sasaki et al. |
| 2016/0149074 | A1 | 5/2016 | Atanackovic et al. |
| 2016/0149075 | A1 | 5/2016 | Atanackovic |
| 2017/0263813 | A1 | 9/2017 | Atanackovic et al. |
| 2017/0287710 | A1 | 10/2017 | Choi et al. |
| 2017/0309779 | A1 | 10/2017 | Atanackovic |
| 2018/0122985 | A1 | 5/2018 | Atanackovic et al. |
| 2018/0315886 | A1 | 11/2018 | Gaevski et al. |
| 2019/0028081 | A1 | 1/2019 | Pelzel et al. |
| 2019/0280098 | A1 | 9/2019 | Ueda et al. |
| 2020/0075799 | A1 | 3/2020 | Atanackovic et al. |
| 2020/0075809 | A1 | 3/2020 | Rajan et al. |
| 2020/0168454 | A1 | 5/2020 | Dargis et al. |
| 2020/0194560 | A1 | 6/2020 | Takizawa et al. |
| 2020/0328164 | A1 | 10/2020 | Delacruz et al. |
| 2020/0328165 | A1 | 10/2020 | Delacruz et al. |
| 2021/0050474 | A1 | 2/2021 | Krause |
| 2021/0074541 | A1 | 3/2021 | Atanackovic |
| 2021/0126091 | A1 | 4/2021 | Chang et al. |
| 2021/0140069 | A1 | 5/2021 | Shrekenhamer et al. |
| 2021/0273415 | A1 | 9/2021 | McLaurin et al. |
| 2021/0351321 | A1 | 11/2021 | Atanackovic |
| 2021/0388526 | A1 | 12/2021 | Zhao et al. |
| 2022/0115544 | A1 | 4/2022 | Miyake |

OTHER PUBLICATIONS

Giang T. Dang, et al., 'α-(AlxGa1-x)2O3 single-layer and heterostructure buffers for the growth of conductive Sn-doped α-Ga2O3 thin films via mist chemical vapor deposition', APL Mater. 8, 101101(2020), Oct. 1, 2020 abstract; pp. 101101-1-101101-5; table I; and figure 1. (https://doi.org/10.1063/5.0023041).

Ildikó Cora et al., 'The real structure of ε-Ga2O3 and its relation to κ-phase', CrystEngComm, 2017, 19, 1509-1516, Feb. 17, 2017 p. 1512. (https://pubs.rsc.org/en/content/articlelanding/2017/ce/c7ce00123a).

International Search Report and Written Opinion dated Aug. 9, 2022 for PCT Patent Application No. PCT/B2021/060413.

International Search Report and Written Opinion dated Aug. 9, 2022 for PCT Patent Application No. PCT/B2021/060414.

International Search Report and Written Opinion dated Aug. 9, 2022 for PCT Patent Application No. PCT/B2021/060466.

M. Kneiß et al., 'Growth, structural and optical properties of coherent κ-(AlxGa1-x)2O3/κ-Ga2O3 quantum well superlattice heterostructures', APL Materials 8, 051112 (2020), May 19, 2020 abstract; and pp. 051112-1-051112-12. (https://doi.org/10.1063/5.0007137).

Mengmeng Shang et al., '(Zn, Mg)2GeO4:Mn2+ submicrorods as promising green phosphors for field emission displays: hydrothermal synthesis and luminescence properties', Dalton Trans., 2011, 40,9379-9387, Aug. 4, 2011, abstract; and pp. 9379-9387. (https://pubs.rsc.org/en/content/articlelanding/2011/dt/c1dt10673b).

Peng Lingling et al., 'Enhanced Photoluminescence and Thermal Properties of Size Mismatch inMg2TixGe1-xO4: Win4+ Deep-Red Phosphors', Journal of Materials Chemistry C, Issue 8, Jan. 28, 2019, abstract; and p. 2. (https://pubs.rsc.org/en/content/articlelanding/2019/tc/c8tc05743e).

St. Senz et al., 'The effect of stress on cubic-to-tetragonal phase transitions in Mg2TiO4 and Mg2GeO4spinel films', Philosophical Magazine A, 2001, vol. 81, No. 1, 109-124, Aug. 5, 2009, abstract; pp. 110-111; and figures 1(d)-1(e), 3.(https://www.tandfonline.com/doi/abs/10.1080/01418610108216621?cookieSet=1).

International Search Report and Written Opinion dated Jul. 18, 2022 for PCT Patent Application No. PCT/IB2021/059945.

Bhuiyan et al., "MOCVD epitaxy of b-(AlxGa 1-x)2O3 thin films on (010) Ga2O3 substrates and N-type doping," Applied Physics Letters 115 (2019) 120602.

Bhuiyan et al., "MOCVD Epitaxy of Ultrawide Bandgap f3 (AlxGa1-x)2O3 with High-Al Composition on (100) f3 Ga2O3 Substrates," Crystal Growth & Design 20 (2020) pp. 6722-6730.

Notice of Allowance and Fees dated Jul. 1, 2022 for U.S. Appl. No. 17/651,712.

(56) References Cited

OTHER PUBLICATIONS

Notice of Allowance and Fees dated Jul. 13, 2022 for U.S. Appl. No. 17/653,824.
Notice of Allowance and Fees dated Jun. 15, 2022 for U.S. Appl. No. 17/658,501.
Office Action dated Jul. 22, 2022 for U.S. Appl. No. 17/653,828.
Office Action dated Jul. 25, 2022 for U.S. Appl. No. 17/658,506.
Office Action dated Jul. 26, 2022 for U.S. Appl. No. 17/651,713.
Office Action dated Jun. 13, 2022 for U.S. Appl. No. 17/658,510.
Office Action dated Jun. 22, 2022 for U.S. Appl. No. 17/651,713.
Office Action dated Jun. 24, 2022 for U.S. Appl. No. 17/652,028.
Office Action dated Jun. 6, 2022 for U.S. Appl. No. 17/651,712.
Office Action dated Jun. 9, 2022 for U.S. Appl. No. 17/652,031.
Office Action dated Jun. 9, 2022 for U.S. Appl. No. 17/653,824.
Oshima et al., $\alpha$-Al2O3/Ga2O3 superlattices coherently grown on r-plane sapphire, Applied Physics Express, 11, 065501, Apr. 2018.
Petricevic et. al. "Room-temperature near-infrared tunable laser operation of Cr4+:Ca2GeO4", Optics Letters vol. 21, Issue 21, pp. 1750-1752 (1996), Optica Publishing (Year 1996).
Ranga et al., "MOVPE-grown Si-doped f3-(AI0.26Ga0.74)2O3 thin films and heterostructures," Template for APEX (2014).
Shuo-Huang Yuan et al. 2018 Jpn. J. Appl. Phys. 57 070301 (Year: 2018).
Vaidya et al., "Enhancement Mode f3-(AlxGa1-x)2O3/Ga2O3 Heterostructure FET (HFET) With High Transconductance and Cutoff Frequency," IEEE Electron Device Letters 42 (2021) pp. 1444-1447.
Kim et al., "In-situ angle-resolved photo emission spectroscopy of copper-oxide thin films synthesized by molecular beam epitaxy" (2018), 2018, 17 pgs, Elsevier.
Lee et al., "In situ surface/interface x-ray diffractometer for oxide molecular beam epitaxy", Review of Scientific Instruments 87, 013901 (2016), 19 pgs, https://doi.org/10.1063/1.4939100.
Piquette et al., "Effect of Buffer Layer and III/V Ratio on the Surface Morphology of GaN Grown by MBE", MRS Internet J. Nitride Semicond. Res. 4S1, G3.77(1999), Pasadena, CA.
Notice of Allowance and Fees dated Dec. 20, 2022 for U.S. Appl. No. 17/658,515.
Notice of Allowance and Fees dated Oct. 28, 2022 for U.S. Appl. No. 17/653,828.
Office Action dated Dec. 22, 2022 for U.S. Appl. No. 17/653,832.
Notice of Allowance and Fees dated Aug. 17, 2022 for U.S. Appl. No. 17/651,713.
Notice of Allowance and Fees dated Aug. 25, 2022 for U.S. Appl. No. 17/652,028.
Notice of Allowance and Fees dated Aug. 25, 2022 for U.S. Appl. No. 17/658,506.
Notice of Allowance and Fees dated Sep. 21, 2022 for U.S. Appl. No. 17/652,031.
Office Action dated Sep. 1, 2022 for U.S. Appl. No. 17/658,515.
Office Action dated Sep. 2, 2022 for U.S. Appl. No. 17/653,832.
Office Action dated Sep. 21, 2022 for U.S. Appl. No. 17/658,510.

\* cited by examiner

METHOD FOR HEATING A WIDE BANDGAP SUBSTRATE BY PROVIDING A RESISTIVE HEATING ELEMENT WHICH EMITS RADIATIVE HEAT IN A MID-INFRARED BAND

RELATED APPLICATIONS

This application is a continuation of International Application No. PCT/IB2021/059945, filed on Oct. 27, 2021, and entitled "Methods and Systems for Heating a Wide Bandgap Substrate"; which is hereby incorporated by reference for all purposes. This application is related to U.S. patent application Ser. No. 16/990,349, filed on Aug. 11, 2020, and entitled "Metal Oxide Semiconductor-Based Light Emitting Device"; which is hereby incorporated by reference for all purposes.

BACKGROUND

In semiconductor fabrication processes, thin film materials are deposited on a planar deposition surface using, for example, a source material in a reaction chamber. The deposition surface is a semiconductor material substrate upon which layers of other materials are grown. The layers have crystalline structures which influence the quality and behavior of the device formed from the layer stack. Molecular beam epitaxy (MBE) is one of several methods of depositing single crystal thin films in a reaction chamber.

MBE takes place in high vacuum (HV) or ultra-high vacuum (UHV). MBE typically involves placing the substrate in the reaction chamber and heating the substrate to promote formation of the crystalline layers as atomic beams from the source materials are directed toward the deposition surface. The substrate is rotated during the process to promote uniformity across the deposition plane. The molecules from the source materials are deposited on the surface of the substrate layer by layer, enabling very thin films to be formed. Important aspects of MBE include the precision and uniform thickness of the films deposited, the deposition rate, the abruptness of interfaces between dissimilar films deposited, and the impurity levels of the films deposited. These aspects can be impacted by the heating of the substrate, such as the temperature profile across the heated substrate and the actual temperatures reached. Accordingly, the ability to heat the substrate during MBE in a consistent and efficient manner is an important facet of MBE processes.

SUMMARY

In some embodiments, methods of heating a substrate in a vacuum deposition process include providing a resistive heater having a resistive heating element. Radiative heat emitted from the resistive heating element has a wavelength in a mid-infrared band from 5 μm to 40 μm that corresponds to a phonon absorption band of a substrate. The substrate comprises a wide bandgap (WBG) semiconducting material. The substrate has an uncoated surface and a deposition surface opposite the uncoated surface. The resistive heater and the substrate are positioned in a vacuum deposition chamber. The uncoated surface of the substrate is spaced apart from and faces the resistive heater. The vacuum deposition chamber is operated at a pressure less than or equal to $5\times10^{-4}$ Torr. Radiative heat is generated from the resistive heating element. The uncoated surface of the substrate is directly heated by absorbing the radiative heat.

In some embodiments, methods of depositing an oxide on a substrate in a vacuum deposition process include positioning a resistive heater and a substrate in a vacuum deposition chamber. The resistive heater has a resistive heating element. The substrate comprises a wide bandgap (WBG) semiconducting material. The substrate has an uncoated surface and a deposition surface opposite the uncoated surface. The substrate is positioned with the uncoated surface being spaced apart from and facing the resistive heating element. The vacuum deposition chamber is operated at a pressure less than or equal to $5\times10^{-4}$ Torr. Radiative heat is generated from the resistive heating element. The radiative heat has a wavelength in a mid-infrared band of 5 μm to 40 μm that corresponds to a phonon absorption band of the substrate. An epitaxial oxide layer is deposited on the deposition surface of the substrate.

In some embodiments, a system for radiatively heating a substrate in a vacuum deposition process includes a vacuum deposition chamber that operates at a pressure less than or equal to $5\times10^{-4}$ Torr. A resistive heater is in the vacuum deposition chamber, wherein the resistive heater generates radiative heat having a wavelength in a mid-infrared band of 5 μm to 40 μm that corresponds to a phonon absorption band of a substrate. The resistive heater comprises two or more individually controlled resistive heating elements arranged in two or more zones. A substrate holder for holding the substrate is in the vacuum deposition chamber. The substrate comprises a wide bandgap (WBG) semiconducting material and has an uncoated surface and a deposition surface opposite the uncoated surface. The substrate holder is configured to position the uncoated surface to be spaced apart from and facing the two or more individually controlled resistive heating elements to receive the radiative heat. The system for radiatively heating a substrate also includes a heating control system that comprises a pyrometer. The heating control system includes an optical filter that selectively allows optical radiation in the mid-infrared band to pass through; measures a plurality of temperatures across the deposition surface of the substrate using the pyrometer, based on the optical radiation through the optical filter; and provides feedback to the resistive heater. The feedback comprising a signal including the plurality of temperatures, to control the two or more individually controlled resistive heating elements.

DETAILED DESCRIPTION

Methods and systems for heating substrates are disclosed that beneficially enable wide bandgap (WBG) semiconducting materials to be heated in vacuum deposition processes. The methods and systems utilize an insight of choosing a heating element material that emits radiative heat matched to the phonon absorption band of the substrate to achieve pure radiative heating. Embodiments enable simplified processes for heating WBG materials, which conventionally require coatings or backing plates that absorb radiative heat and then heat the WBG substrate by conduction. Embodiments also enable WBG materials to be efficiently heated in high vacuum processes, where convection heating effects are largely absent due to the vacuum environment. The materials for the heating elements can also be chosen to be resistant to oxidation, making them suitable for growing epitaxial oxide layers on WBG substrates.

High vacuum deposition systems and processes throughout this disclosure shall be defined as operating at pressures of less than or equal to $5 \times 10^{-4}$ Torr (vacuum higher than 5e-4 Torr), such as less than or equal to $10^{-6}$ Torr, or from $5 \times 10^{-4}$ Torr to $10^{-11}$ Torr, or from $10^{-5}$ Torr to $10^{-11}$ Torr. Embodiments also include use of ultra-high vacuum (UHV) (e.g., approximately $10^{-6}$ to $10^{-9}$ Pa, or $10^{-8}$ to $10^{-11}$ Torr).

Figure 1:
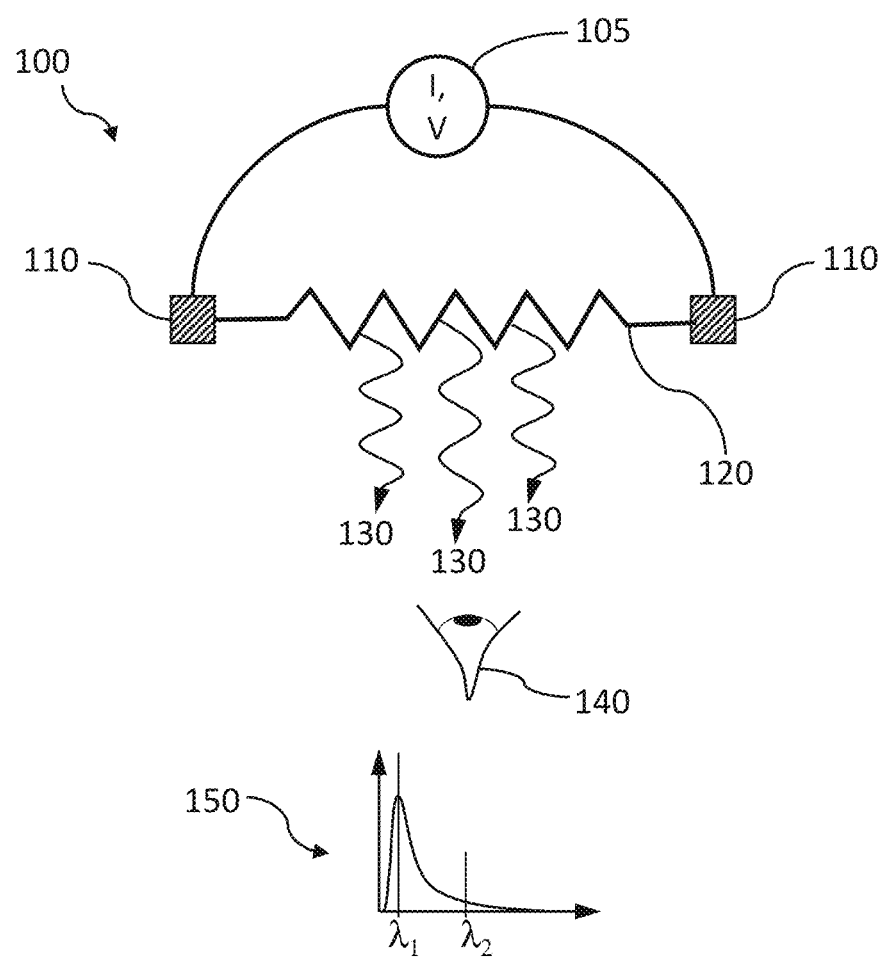
FIG. 1 is a schematic of a conventional heating arrangement for heating a standard substrate with a refractory metal filament, as known in the art.

FIG. 1 is a schematic side view of a conventional heating lamp 100 for heating a substrate based on the use of a refractory metal heat filament 120. Substrate heating, such as in an MBE process, is typically performed at high temperature and at high or ultra-high vacuum. In this example, metal filament 120 is a wire that is powered by a current/voltage source 105 which provides current to metal filament 120 via electrodes 110. When electricity runs through metal filament 120, the metal filament 120 emits radiation 130. In a vacuum environment, the emitted radiation 130 is in accordance with a black body spectrum 150 as would be seen by an observer 140 spaced from the heating lamp 100. Spectrum 150 has a wavelength $\lambda_1$ that represents the peak wavelength of the spectrum, and a wavelength $\lambda_2$ that represents a longer wavelength emitted by the black body spectrum 150.

Table 1 shows example refractory metals that are conventionally employed as heating element filaments in the heating lamp 100 and their relevant physical properties of melt temperature, oxidation resistance and conductivity. Oxidation resistance is the ability of the material to resist compositional breakdown at high temperatures and high vacuum. Oxidation can cause devitrification of the surface as the material decomposes or flakes or cracks.

TABLE 1

Conventional radiative heating element materials

| Refractory Metal | Melt Temperature (K) | Oxidation Resistance | Conductivity (nΩ.m at 300 K) |
|---|---|---|---|
| Tungsten, W | 3695 | Medium | 52.8 |
| Tantalum, Ta | 3290 | Poor | 131 |
| Iridium, Ir | 2719 | Good | 47.1 |
| Titanium, Ti | 1941 | Poor | 420 |
| Nickel, Ni | 1728 | Poor | 69.3 |
| Molybdenum, Mo | 2896 | Good | 53.4 |
| Platinum, Pt | 2041 | Medium | 105 |

Figure 2:
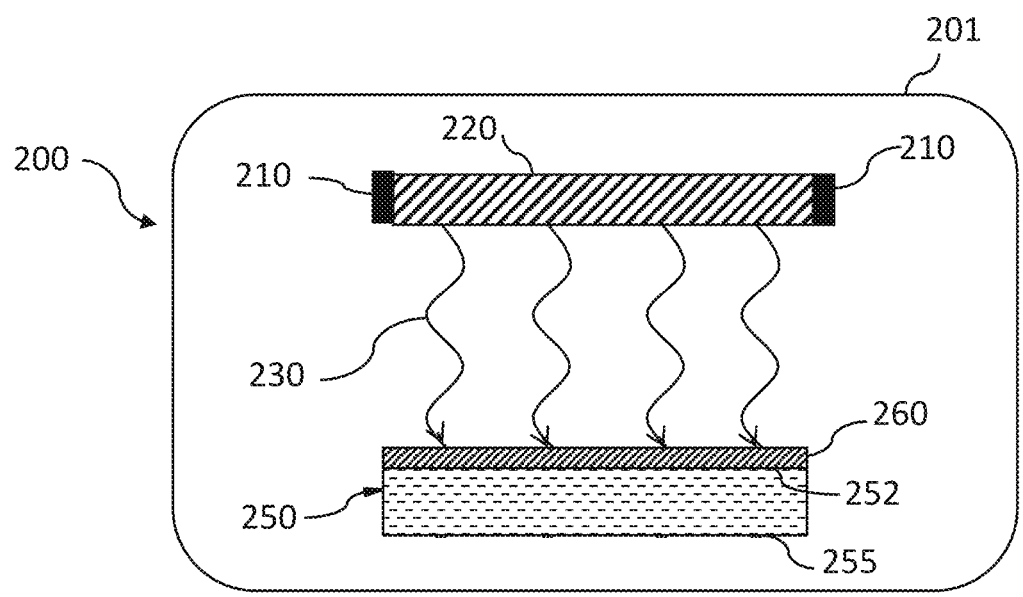
FIG. 2 is a schematic of a conventional radiative heating arrangement involving the application of a metal film to the heating surface of a wide bandgap (WBG) substrate in a vacuum deposition system, as known in the art.

FIG. 2 is a figurative diagram of a conventional heating arrangement 200 for a vacuum deposition system comprising a deposition chamber 201, for attempting to radiatively heat a substrate 250 that comprises a wide bandgap (WBG) semiconducting material. Substrate 250 is typically round (i.e., a circular disk) and is rotated during the deposition process. Radiative heating arrangement 200 includes a resistive heater 220 having a refractory metal heating element such as the metal filament 120 of FIG. 1. Substrate 250 has a back surface 252 that is toward the resistive heater 220, and a front surface 255 on which layers can be grown in a vacuum deposition process. Radiative heating arrangement 200 conducts an electric current to the resistive heater 220, delivered via electrodes 210, causing the resistive heater 220 to generate radiation 230. For WBG materials as in FIG. 2, the WBG substrate 250 is transparent to the generated radiation 230 as there is little or no overlap between the absorption spectrum of the WBG substrate 250 and the black body spectrum of the resistive heater 220.

A conventional approach to addressing this problem is to apply a metal film 260 to the back surface 252 of the WBG substrate 250. The metal film 260 can be a coating formed on back surface 252. The metal film 260 is made of a material such as molybdenum (Mo) or tungsten (W) that absorbs radiative heat from the heating element (resistive heater 220), where the heat is then transferred by conduction into the WBG substrate 250. Although this approach successfully heats WBG substrate 250, coating the substrate involves extra film deposition steps for applying the metal film 260. Furthermore, when the substrate is coated, the process may involve steps for removing the metal film 260 in order to process the structure comprising the substrate and deposited layers into an electronic device. Contamination of the deposition surface 255 of the WBG substrate 250 can occur during both steps of applying and removing the coating. Another conventional approach for heating substrates includes doping the substrate material to attempt to achieve some radiative heat absorption in a bandgap range below the natural (undoped) range of the substrate material. However, this approach is not applicable to WBG materials, as doping does not extend absorption into the wavelength band of the generated radiation 230 produced by conventional resistive heaters (e.g., refractory metals).

Table 2 provides example substrate materials for vacuum deposition processes, with wide bandgap materials for substrates being indicated as "Transparent" in relation to radiative heat from conventional resistive heaters, and standard substrates indicated as "Opaque." The standard substrates are conventional semiconductor substrates which may be heated by conventional radiative heaters but without the use of a metal film 260 as in heating arrangement 200 since they are opaque to radiative heat from conventional resistive heaters. Table 2 also shows example physical form factors of the substrates as well as the bandgap energy (in electron-volts, eV) and the associated bandgap wavelength $\lambda_g$ (in nanometers, nm) and frequency (cm$^{-1}$) for each substrate. As can be seen, the WBG substrates ("transparent" substrates) in Table 2 all have bandgap energies above 3 eV. In this disclosure, a WBG substrate shall be a substrate that comprises a wide bandgap semiconductor material having a bandgap energy greater than or equal to 2 eV, such as greater than 3 eV.

TABLE 2

| Substrate Bulk Material | Thickness (mm) | Diameter (mm) | Bandgap (eV) | Bandgap wavelength (nm) | Bandgap frequency (cm$^{-1}$) |
|---|---|---|---|---|---|
| Transparent to conventional heaters (Wide bandgap substrates) | | | | | |
| Sapphire, Al$_2$O$_3$ | 0.1-1.0 | 50-200 | 8.9 | 139 | 1.4 × 10$^{-6}$ |
| Gallium Oxide, Ga$_2$O$_3$ | 0.1-1.0 | 50-150 | 4.9 | 253 | 2.5 × 10$^{-6}$ |
| Silicon Carbide, 4H-SiC | 0.1-1.0 | 50-150 | 3.4 | 364 | 3.6 × 10$^{-6}$ |
| Magnesium Oxide, MgO | 0.1-1.0 | 50-100 | 7.7 | 161 | 1.6 × 10$^{-6}$ |
| Lanthanum Aluminum Oxide, LaAlO$_3$ | 0.1-1.0 | 10-50 | 5.6 | 221 | 2.2 × 10$^{-6}$ |
| Gadolinium Gallium Oxide, Gd$_3$Ga$_5$O$_{12}$ | 0.1-1.0 | 10-50 | 5.6 | 221 | 2.2 × 10$^{-6}$ |
| Magnesium Fluoride, MgF$_2$ | 0.1-1.0 | 10-50 | 11.9 | 104 | 1.0 × 10$^{-6}$ |
| Lithium Fluoride, LiF | 0.1-1.0 | 10-50 | 13.9 | 89 | 8.9 × 10$^{-6}$ |
| Magnesium Gallium Oxide, MgGa$_2$O$_4$ | 0.1-1.0 | 10-25 | 6.2 | 200 | 2.0 × 10$^{-6}$ |
| Opaque to conventional heaters ("Standard" substrates) | | | | | |
| Gallium Arsenide, GaAs | 0.1-1.0 | 50-100 | 1.4 | 885 | 8.9 × 10$^{-6}$ |
| Silicon, Si | 0.1-1.0 | 50-450 | 1.1 | 1126 | 1.1 × 10$^{-6}$ |
| Indium Phosphide, InP | 0.1-1.0 | 50 | 1.3 | 953 | 9.5 × 10$^{-6}$ |
| Germanium, Ge | 0.1-1.0 | 50-100 | 0.7 | 1770 | 1.8 × 10$^{-6}$ |

The relation between the bandgap energies of WBG substrates and their transparency to conventional radiative heating elements shall now be described in FIG. 3A through FIG. 5.

Figure 3A:
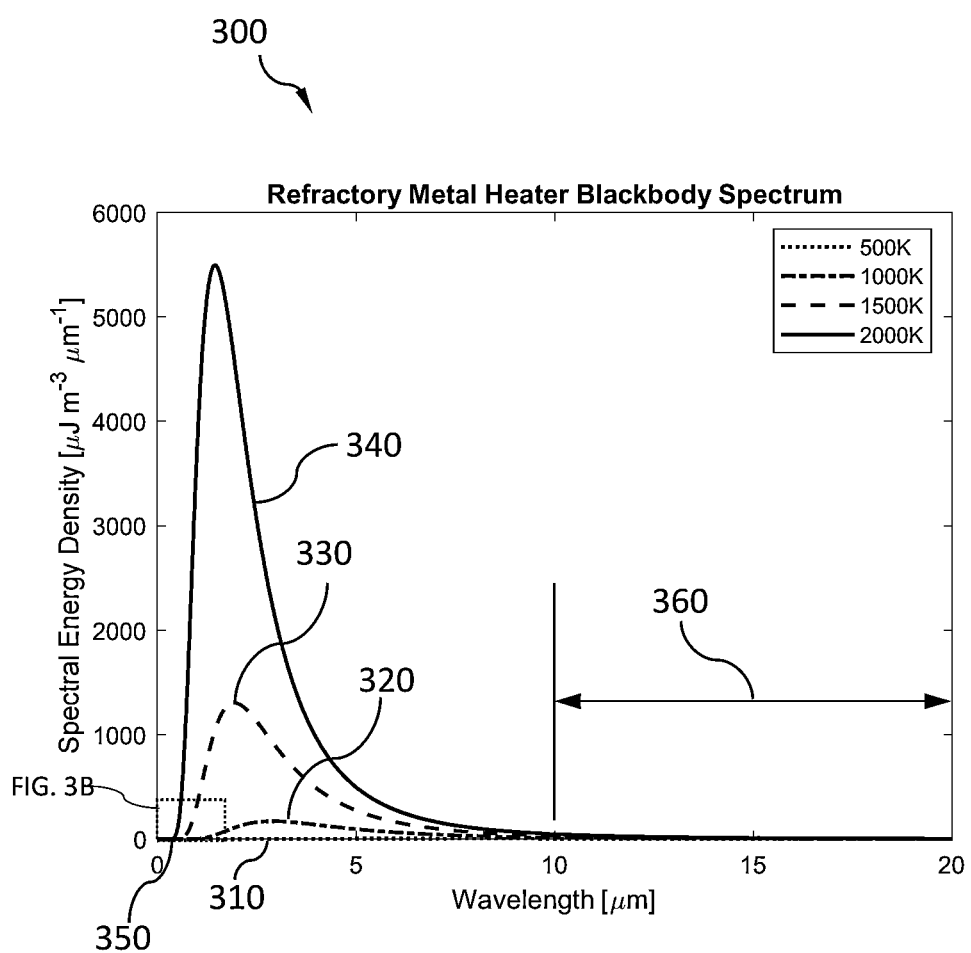
FIG. 3A is a plot of the spectral energy density of radiation emitted from a refractory metal heater as a function of wavelength, at various temperatures.

Referring to FIG. 3A, a plot 300 represents the spectral energy density of radiation emitted from a conventional refractory metal heater (e.g., heating lamp 100) as a function of wavelength. Emission spectra are shown for four temperatures, with curve 310 (near the x-axis) being for 500 K, curve 320 being for 1000 K, curve 330 being for 1500 K, and curve 340 being for 2000 K. Plot 300 illustrates the conventional black body spectrum of these types of heating elements and demonstrates the dependence of emission spectra on temperature. As can be seen, the emission spectra follow Planck's law with total emitted energy increasing as expected for higher temperatures. For example, the area under curve 340 for 2000 K is greater than the area under curve 330 for 1500 K. Also, the peak spectral energy density moves to lower wavelengths with increasing temperature. For example, the peak wavelength for curve 340 is lower than the peak wavelength for curve 330. Each spectrum exhibits a rapidly decreasing spectral energy density past the peak wavelength, with negligible energy emitted in the wavelength region 360, above approximately 10 μm.

Figure 3B:
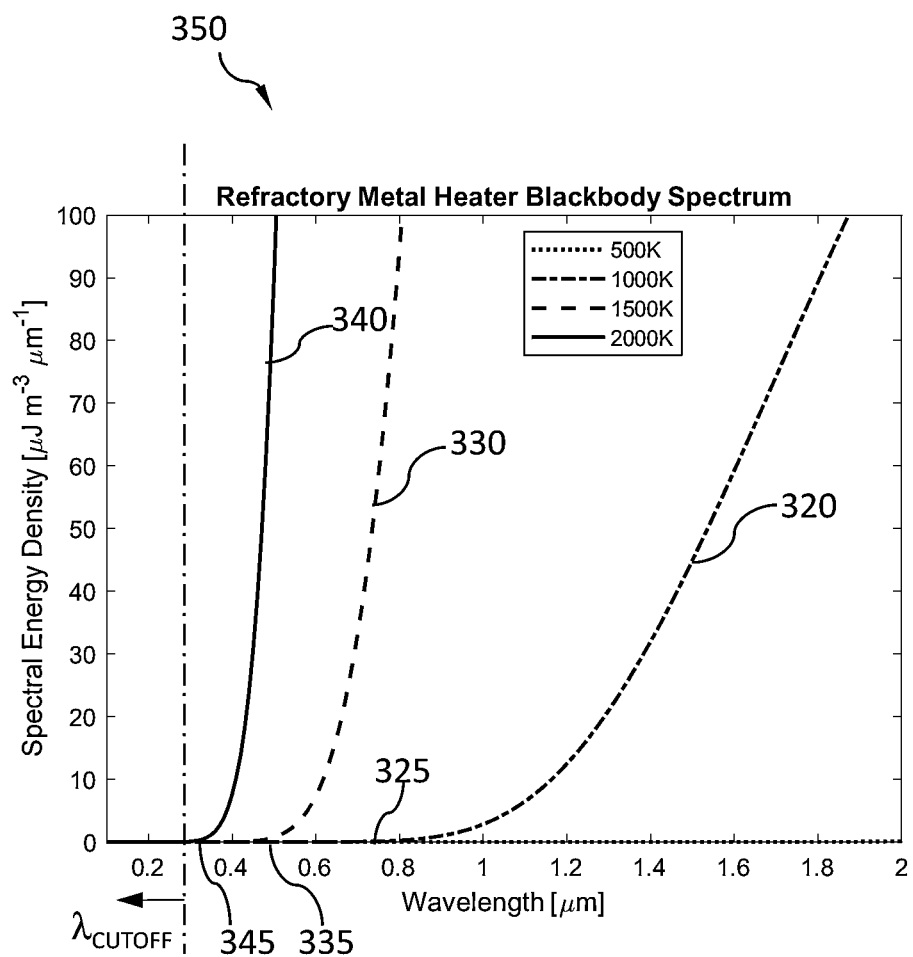
FIG. 3B is a close-up view of the low wavelength cut off region of the black body spectra illustrated in FIG. 3A.

FIG. 3A also shows that the emission spectra of conventional refractory metal heaters have a low wavelength cut-off in a region 350 with wavelengths approximately less than 1 μm. A detailed plot of this low wavelength cut-off region 350 of the black body spectra of FIG. 3A is shown in FIG. 3B. The low wavelength cut-off ($\lambda_{CUTOFF}$) is the wavelength below which negligible energy is emitted, as illustrated by the dot-dash line vertical line (not associated with a specific curve) in FIG. 3B. Curve 320 has a low wavelength cut-off 325, curve 330 has a low wavelength cut-off 335, and curve 340 has a low wavelength cut-off 345. As can be seen, even though the wavelength cut-off decreases for higher temperatures, the emission cut-off is still above 0.3 μm (or below about 4.1 eV) for high temperatures of circa 2000 K (curve 340).

Figure 4:
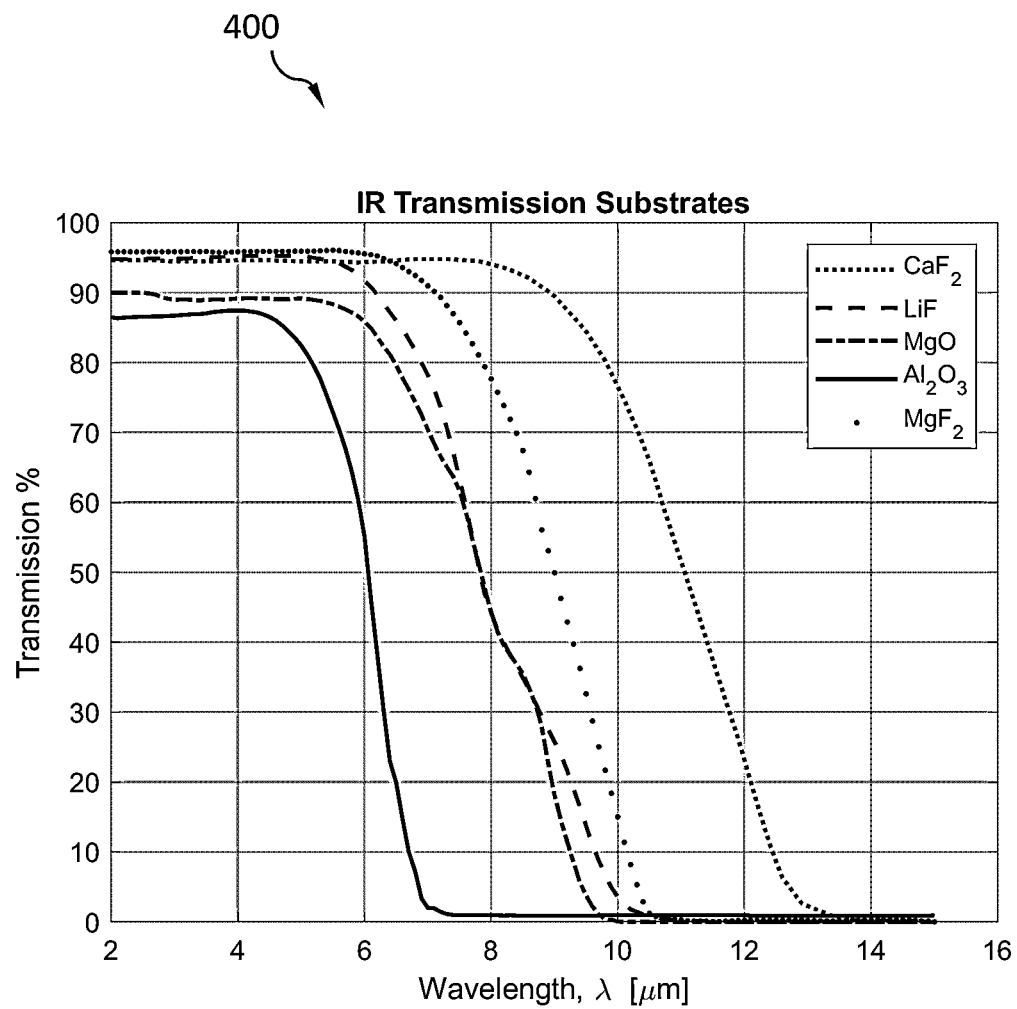
FIG. 4 is a plot showing the infrared transmissibility of example WBG substrates, in accordance with some embodiments.

FIG. 4 shows a plot 400 that models the infrared transmissibility of several WBG substrates in the wavelength region of 2 μm to 16 μm. In plot 400, curves are shown for CaF$_2$, LiF, MgO, Al$_2$O$_3$ and MgF$_2$. As can be seen, the WBG substrates have extremely high transmissibility (i.e., over 80%) at wavelengths up to 5 μm with some materials such as CaF$_2$ exhibiting transmissibility at wavelengths up to 10 μm. The wavelengths of high transmission (i.e., transparency) of the WBG substrates coincide with the primary energy densities emitted by the conventional refractory metal heaters of FIG. 3A. Thus, the energy emitted by the conventional refractory metal heaters of FIG. 3A—being primarily at wavelengths less than 10 μm with negligible energy density at wavelengths greater than 10 μm—will fail to heat the WBG substrates of FIG. 4, as was described in relation to FIG. 2. FIG. 4 also shows that these WBG substrates absorb IR (have low transmission) at longer wavelengths due to the presence of an optical phonon band, as will described further herein.

Figure 5:
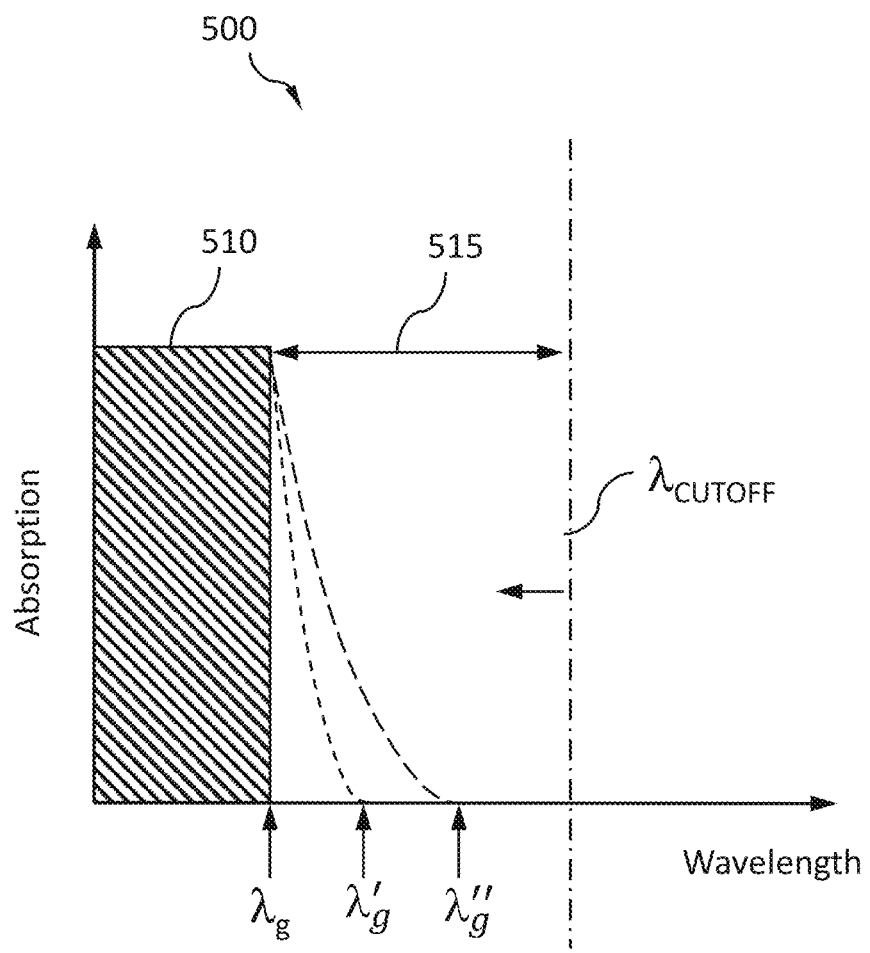
FIG. 5 is a plot illustrating the effect of doping a WBG substrate to increase the bandgap absorption wavelength $\lambda_g$ of the WBG substrate, as known in the art.

FIG. 5 shows a plot 500 that models a conventional effect of treating a WBG substrate by doping, to increase the bandgap absorption wavelength $\lambda_g$ of the WBG substrate and consequently promote absorption of black body radiation from a heating element. Plot 500 shows absorption versus wavelength, with region 510 being wavelengths that will be absorbed by the substrate. $\lambda_g$ is the bandgap absorption wavelength without any doping of the substrate, $\lambda'_g$ is the wavelength with some amount of impurity-doping, and $\Delta''_g$ is with a higher amount of impurity-doping. Although FIG. 5 shows that increased impurity-doping can function to redshift $\lambda_g$ to a greater wavelength (i.e., $\lambda''_g > \lambda'_g > \Delta_g$), these wavelengths are still below the low wavelength cut-off ($\lambda_{CUTOFF}$) of the blackbody spectra shown in FIG. 3B, as indicated by arrow 515. In general, semiconductors create further free carriers at high temperatures which also redshift the absorption edge; however, for the substrates of interest in this disclosure this is not sufficient to couple to conventional radiative heating methods.

As can be seen by FIGS. 3A-5, a heating arrangement based on a conventional refractory metal such as those referred to in Table 1 will generate radiation having a spectral energy density with a low wavelength cut off (see FIG. 3B) that will be above the bandgap absorption wavelength $\lambda_g$ of the WBG substrate and whose peak energy density (as seen in FIG. 3A) corresponds to the peak transmissibility of WBG substrate (FIG. 4). This combination of factors results in WBG substrates having low absorption of the radiation emitted from conventional refractory metal heating elements, meaning that there will be little radiative heating of the WBG substrate.

Wide bandgap substrates offer the potential for a greater range of materials to be grown in vacuum deposition processes, and thus improvements in heating WBG substrates are desired in the industry. For example, WBG substrates offer the ability for epitaxial oxide layers to be grown on a native material (i.e., oxide layers on oxide substrate), which can improve the quality and properties of the resulting devices. Efforts in the industry in growing oxide layers have been challenging, as feeding oxygen gas into a vacuum deposition chamber for growing oxides can cause conventional heating elements (e.g., tungsten, tantalum) to combust, create surface and bulk oxidation, become brittle and structurally weak. The heating elements (e.g., a refractory metal wire heater) could be enclosed in a glass body such as a lamp to protect the heating element from oxygen. However, glass is unable to withstand the high temperatures desirable for use in MBE and furthermore, the glass is likely to absorb IR wavelengths needed for heating WBG substrates and therefore would reduce efficacy. Enabling improvements in radiative heating of wide bandgap substrates is particularly important because in vacuum deposition processes such as MBE that operate at high vacuum levels (e.g., less than or equal to $10^{-4}$ Torr), gas convection heating effects are not possible and conductance heating is challenging. Thus, the ability to achieve pure radiative heating in an efficient manner is highly desirable for vacuum deposition processes.

Embodiments of the present disclosure uniquely achieve heating of WBG substrates in vacuum deposition processes solely with radiative heating, by utilizing certain WBG heater materials such as SiC and $Ga_2O_3$ that exhibit phonon dependent radiation in a mid-infrared (mid-IR) band that overlaps with a phonon absorption band of WBG substrates. That is, embodiments utilize phonon-based heating mechanisms which have not been recognized in the industry for heating WBG substrates. Phonons are quasiparticles associated with lattice vibrations in a crystal. Although phonons have a much lower energy than the bandgap energy of a material, they are recognized in this disclosure as an effective heating source by coupling photon energy radiated from a heating element with the phonon absorption of the substrate being heated. Using SiC as an example, SiC has phonon dependent absorption and emittance properties such that a resistive heating element formed of SiC advantageously radiates in the mid-infrared wavelength region corresponding to the optical phonon band of the SiC. Furthermore, emission of mid-infrared radiation in this wavelength region corresponds to or overlaps at least a portion with the phonon absorption band of some WBG substrates, which can therefore be heated by the resistive heating element. The SiC for the heater material can be of various polytypes such as 3C—SiC, 2H—SiC, 4H—SiC, 6H—SiC, 15R—SiC or others, where H refers to hexagonal lattice type, C refers to cubic lattice type, and R refers to rhombohedral lattice type. The polytypes can also be expressed as space groups, such as: 2H—SiC, 4H—SiC and 6H—SiC in P63mc space group (hexagonal); 3C—SiC in F43m space group (cubic); or other polytypes with trigonal space group (e.g., P3m1, R3m). In some embodiments, a single crystal wafer can be machined into a desired shape of the heater element. In other embodiments, a polycrystalline wafer can be used, which may enable lower costs than single crystal, as polycrystals can be grown without the need for a seed crystal. In further embodiments, a polycrystalline powder (e.g., SiC) is sintered and pressed into a shape to be used as a resistive heater. Polycrystalline materials may include one or more polytypes of the material. Further description of making heating elements is described in FIG. 19.

Embodiments involve using wide bandgap materials as a resistive heating element in radiatively heating WBG substrates. In addition to SiC and $Ga_2O_3$ mentioned above, other materials that may be used as heater materials include a SiC element with a $Ga_2O_3$ coating, or an n-type SiC, or an n-type $Ga_2O_3$. Additional materials that have a wide bandgap and electrical conductivity suitable for current flow to enable resistive heating are possible for the resistive heating element. In some embodiments, the WBG semiconducting material of the substrate is an oxide and has a bandgap from 3 eV to 9 eV. Embodiments also provide resistive heating elements that are resistant to oxidation or that are unaffected by an O-atmosphere. Thus, the present resistive heating elements are beneficial for depositing oxide layers in epitaxial processes. For example, SiC and $Ga_2O_3$ resist compositional breakdown at high temperatures and at pressures approaching 1e-4 Torr. In fact, $Ga_2O_3$ decomposition is suppressed at high oxygen levels and thus $Ga_2O_3$ is suitable as a resistive heating element for deposition processes for forming epitaxial oxide layers. Large sheets of single crystal and polycrystalline $Ga_2O_3$ can be produced using, for example, edge-fed melt formation process and therefore offer advantage for scaling to larger heater sizes.

In some embodiments, the semiconducting materials used for the present resistive heaters, such as SiC and $Ga_2O_3$, may be made in a way such that the materials are naturally conductive. In other embodiments, the semiconducting materials may be appropriately doped by known methods to provide sufficient electrical conductivity for the material to serve as a resistive heating element. For example, the semiconducting materials may be doped with impurities to become n-type doped, such as with doping concentrations of about 1e17 $cm^{-3}$ to about 1e20 $cm^{-3}$. Using SiC as one example, nitrogen may be used as a dopant during formation of a SiC heating element to make the SiC n-type. In another example, $Ga_2O_3$ may be doped with Si, Ge, or Sn during formation of the heating element to make the $Ga_2O_3$ n-type. In some embodiments, the semiconducting materials may be p-type doped. The semiconducting materials for the resistive heaters may be polycrystalline or single crystal material. The semiconducting materials for the resistive heaters may also be selected from materials exhibiting large or small domain polycrystalline material. Other semiconducting composite materials may comprise micro- and nano-crystallites that are high temperature sintered into a suitable heater article.

Figure 6:
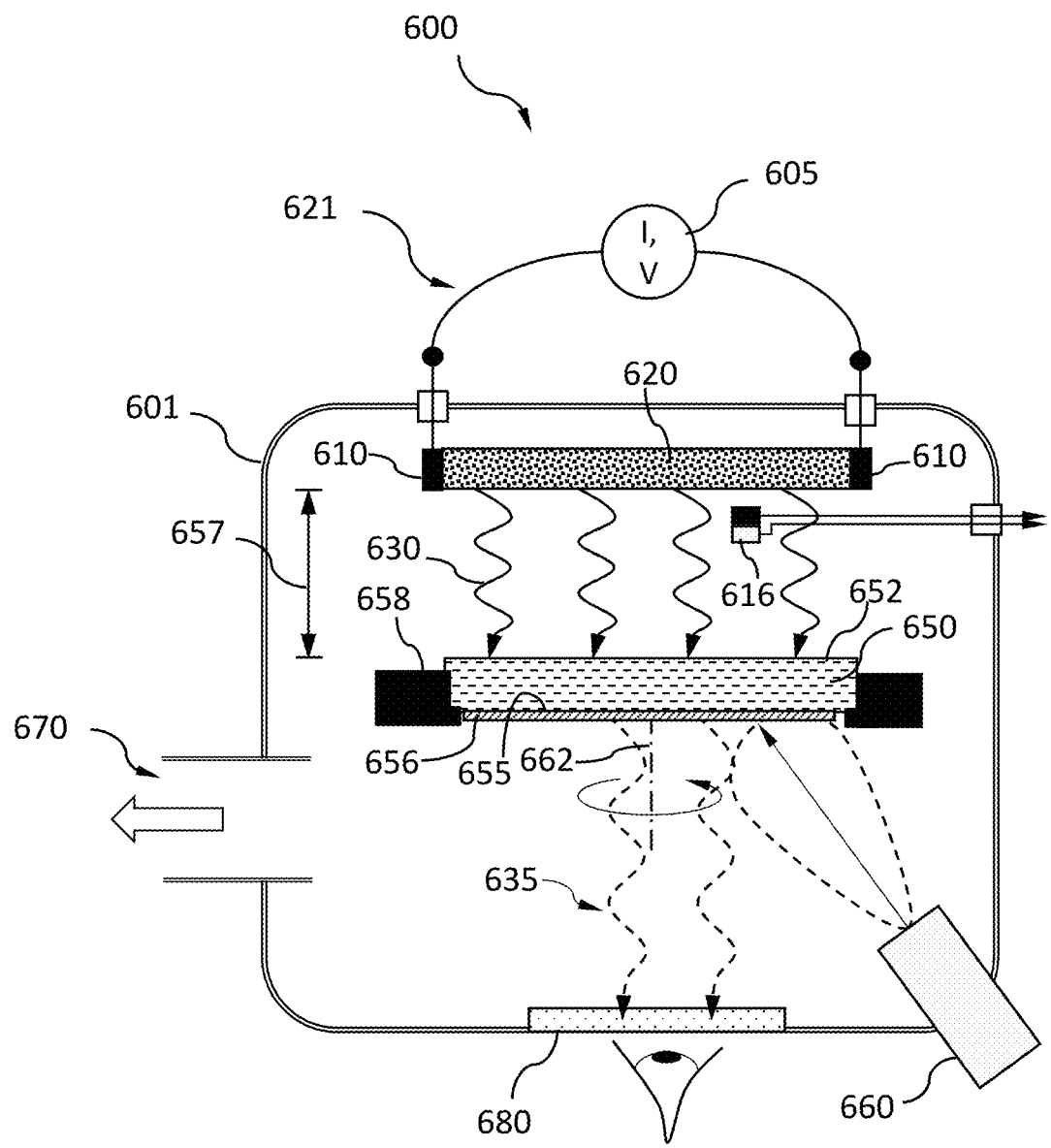
FIG. 6 is a diagram of a heating system for radiatively heating a WBG substrate in a vacuum deposition process, in accordance with some embodiments.

FIG. 6 shows a heating system 600 for radiatively heating a WBG substrate in a vacuum deposition process, in accordance with some embodiments. System 600 comprises a deposition chamber 601 which is maintained at a high or ultrahigh vacuum pressure, such as less than or equal to $10^{-4}$ Torr, by pumping apparatus 670. A heating arrangement 621 includes a current or voltage source 605 which generates electricity to resistive heating element 620 through electrodes 610. Resistive heating element 620 is chosen to be made of a material that radiates infrared radiation 630, including mid-infrared radiation, in a wavelength band corresponding to a phonon absorption band of a WBG substrate 650 when the resistive heating element 620 is energized with electricity. In embodiments, radiative heat emitted from the resistive heating element 620 has a wavelength in a mid-infrared band of 5 µm to 40 µm that corresponds to a phonon absorption band of a substrate 650. Substrate 650 comprises a wide bandgap semiconducting material and is held by a substrate holder 658 which may include a rotatable platen. Substrate 650 has an uncoated surface 652 (back surface) facing the resistive heating element 620, and a deposition surface 655 (front surface) that is opposite the uncoated surface 652. The uncoated surface 652 is without a deposited coating (i.e., has no coating on its surface), and substrate holder 658 does not include a plate (as is used in conventional practices) that absorbs the radiative heat and that heats the substrate by conduction. Uncoated surface 652 is spaced apart from the resistive heating element 620 by a distance 657. The substrate holder 658 is larger in diameter than the substrate 650 to have sufficient structural integrity at the high temperatures used during deposition. For example, the substrate holder 658 may have a diameter that is approximately 20% larger than the substrate 650, where sapphire wafers for the substrate 650 may be up to approximately 200 mm diameter (approximately 8 inches), and MgO wafers may be up to approximately 150 mm (approximately 6 inches).

Because radiation 630 has a wavelength band that corresponds to the phonon absorption band of WBG substrate 650, the WBG substrate 650 highly absorbs radiation 630. Thus, WBG substrate 650 is directly heated by radiative heating only, without convection (since there is an absence of gases in the vacuum deposition chamber 601) or conduction (since there is no coating or backing plate covering the back surface 652 of substrate 650). In contrast, conventional heaters as described in relation to FIG. 2 emit radiative heat that is unable to be absorbed by WBG substrate 650, due to low absorption of WBG substrate 650 to the wavelengths radiated by conventional heaters.

During the deposition process, the heated substrate 650 is rotated around a central axis 662 by the rotatable platen of substrate holder 658, and material from a deposition source 660 is deposited on deposition surface 655 to create an epitaxial layer 656, such as an epitaxial oxide layer. Deposition source 660 provides a flux profile of a deposition species which creates a desired layer (e.g., uniform deposition) across the deposition or growth surface (deposition surface 655) upon rotation of WBG substrate 650 about central axis 662. In various embodiments, deposition source 660 may include a plurality of sources such as elemental sources (e.g., Al, Ga, Ge, Zn, Mg, O and N) capable of producing atomic or molecular species as beams of a pure constituent of atoms. Deposition source 660 may comprise effusion type sources of elements in liquid form. Deposition source 660 may also include one or more plasma sources or precursor-based gas sources (e.g., oxygen, nitrogen). In some embodiments, active oxygen sources may be provided via plasma excited molecular oxygen (forming atomic-O and $O_2$*), ozone ($O_3$), nitrous oxide ($N_2O$), nitrogen dioxide ($NO_2$) and the like. In some embodiments, plasma activated oxygen is used as a controllable source of atomic oxygen. A plurality of gases can be injected via deposition sources 660 to provide a mixture of different species for growth. For example, atomic and excited molecular nitrogen enable n-type, p-type and semi-insulating conductivity type films to be created in oxide-based materials.

Heating system 600 in this embodiment further comprises a thermocouple 616 arranged to measure the temperature of heating element 620. Thermocouple 616 is near the surface of the heating element 620 that faces substrate 650 but is not in contact with the heating element 620. Having the thermocouple separated from the surface of the heating element 620 helps prevent damage of the thermocouple 616 due to the high temperatures used and reduces the effect of other influences such as variation in accuracy of sensing the heater and/or substrate temperature that would occur if in mechanical contact. Thermocouple 616 may be employed as a sensor to vary the amount of current delivered by electrodes 610 from current or voltage source 605 to control the temperature of heating element 620. Heating system 600 also includes a viewport 680 which is configured to transmit radiation 635 that is generated from the heated substrate 650 in accordance with the temperature of the deposition surface 655. Radiation 635 as viewed through viewport 680 can be selectively filtered to correspond to the temperature of the substrate 650 and not to the temperature of the resistive heating element as is typically the case with conventional practices. The viewport 680 is ideally non-absorbing at the desired sensing wavelengths; however, even with substantial absorption a transmitted signal can be monitored via an amplified photodiode and/or sensor.

In an example embodiment, the substrate 650 is a metal oxide wide bandgap semiconductor material, and the uncoated surface 652 of substrate 650 is heated radiatively using a resistive heating element 620 made of silicon carbide (any polymorph, including 3C—SiC, 2H-SiC, 4H-SiC, and 6H-SiC or polycrystalline form including one or more polytypes). The SiC heater has the unique advantage over conventional refractory metal filament heaters of having a high near-to-far infrared emissivity, therefore providing a blackbody emissivity matched to the below-bandgap absorption of the metal oxide substrate. In a further example with $Ga_2O_3$ as the substrate material, the SiC heater emissivity closely matches the intrinsic $Ga_2O_3$ phonon absorption properties and thus couples well to the radiative blackbody emission spectrum presented by the SiC heater. These example embodiments may be used for growing oxide layers on the deposition surface 655.

In some embodiments, non-equilibrium growth techniques can be utilized to operate at growth parameters well away from the melting point of the target metal oxide and can even modulate the atomic specie present in a single atomic layer of a unit cell of crystal along a preselected growth direction. In an example method for growing oxide layers, the deposition surface 655 (epitaxial growth surface) is oxidized to form an activated epitaxial growth surface. The activated epitaxial growth surface is exposed to one or more atomic beams each comprising high purity metal atoms and one or more atomic beams comprising oxygen atoms under conditions to deposit two or more epitaxial metal oxide films or layers. Substrate 650 rotates about axis 662 and is heated radiatively by heating element 620 having an emissivity designed to match the phonon absorption band of metal oxide substrate 650. The high vacuum deposition chamber 601 has various deposition sources 660, such as a plurality of elemental sources capable of producing atomic or molecular species as beams of a pure constituent of atoms. Vacuum deposition chamber 601 can also include one or more plasma sources or gas sources (not shown) connected to a gas feed (e.g., to supply oxygen). Active oxygen sources may be provided via plasma excited molecular oxygen (forming atomic-O and $O_2$*), ozone ($O_3$), nitrous oxide ($N_2O$) and the like. In some embodiments, plasma activated oxygen is used as a controllable source of atomic oxygen. A plurality of gases can be injected to provide a mixture of different species for growth. For example, atomic and excited molecular nitrogen enable n-type, p-type and semi-insulating conductivity type films to be created in GaOxide-based materials. Other methods for growing epitaxial oxide layers can be utilized as described in U.S. patent application Ser. No. 16/990,349, "Metal Oxide Semiconductor-Based Light Emitting Device."

Properties that are recognized in the present disclosure as making certain materials uniquely suitable for heating WBG substrates shall be described in relation to FIGS. 7A-12. Although SiC shall primarily be used as an example, embodiments also apply to other semiconducting materials to be used for the resistive heating element, such as $Ga_2O_3$, SiC coated with $Ga_2O_3$, an n-type SiC, or an n-type $Ga_2O_3$.

Figure 7A:
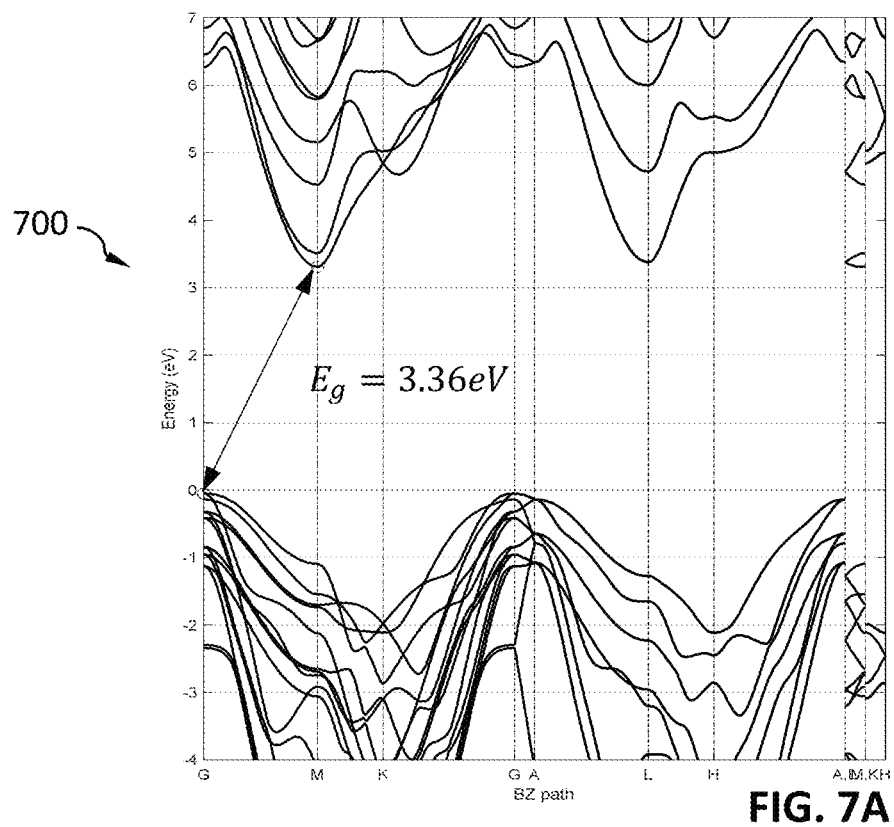
FIGS. 7A and 7B are plots of the band structure and associated density of states, respectively, for single crystal SiC.
Figure 7B:
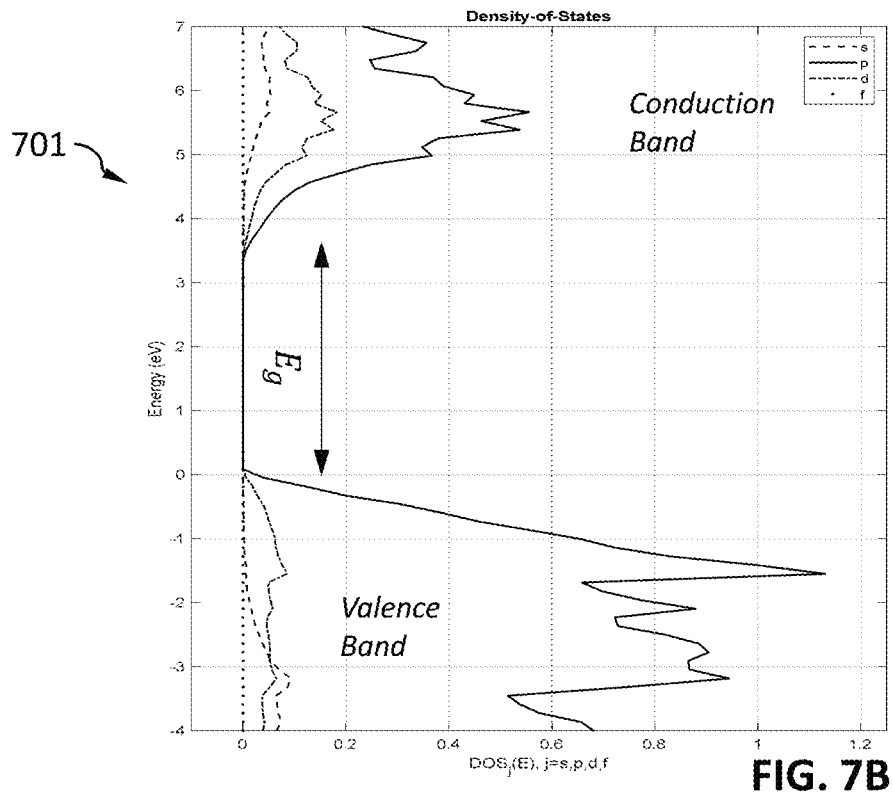

FIG. 7A shows a model of the band structure for single crystal SiC (4H-SiC in this example), in a plot 700 of energy (eV) versus Brillouin zone (BZ) path. FIG. 7B shows a density of states diagram 701 associated with the SiC band structure of FIG. 7A, where diagram 701 models the energy (eV) versus density of states. Both the plot 700 and diagram 701 show that SiC has a bandgap $E_g$ of 3.36 eV and is an ultraviolet (UV) material that would be expected to not absorb in the infrared (IR) wavelength region. That is, the bandgap energy of 3.36 eV corresponds to a bandgap wavelength of approximately 364 nm which is in the UV range, compared to mid-IR wavelengths being approximately 5 μm to 40 μm. Since infrared wavelengths are longer than UV and therefore have lower energy than the bandgap energy of SiC, SiC would not be expected to absorb infrared radiation. However, the present disclosure uses WBG materials such as SiC as resistive heaters to provide pure radiative heating of WBG substrates, by utilizing an insight that particular semiconducting materials are capable of phonon-based excitation and resulting coupling to phonon-photon emission energies that can be absorbed advantageously by WBG substrates. In some embodiments, the semiconducting materials may be appropriately doped by known methods to become electrically conductive to serve as a resistive heating element. In an example embodiment, SiC is n-type doped to provide electrical conductivity to the SiC, enabling it to serve as a resistive heating material. In another example, $Ga_2O_3$ may be used as the resistive heating element, where the $Ga_2O_3$ may be n-type doped to provide electrical conductivity.

Figure 8A:
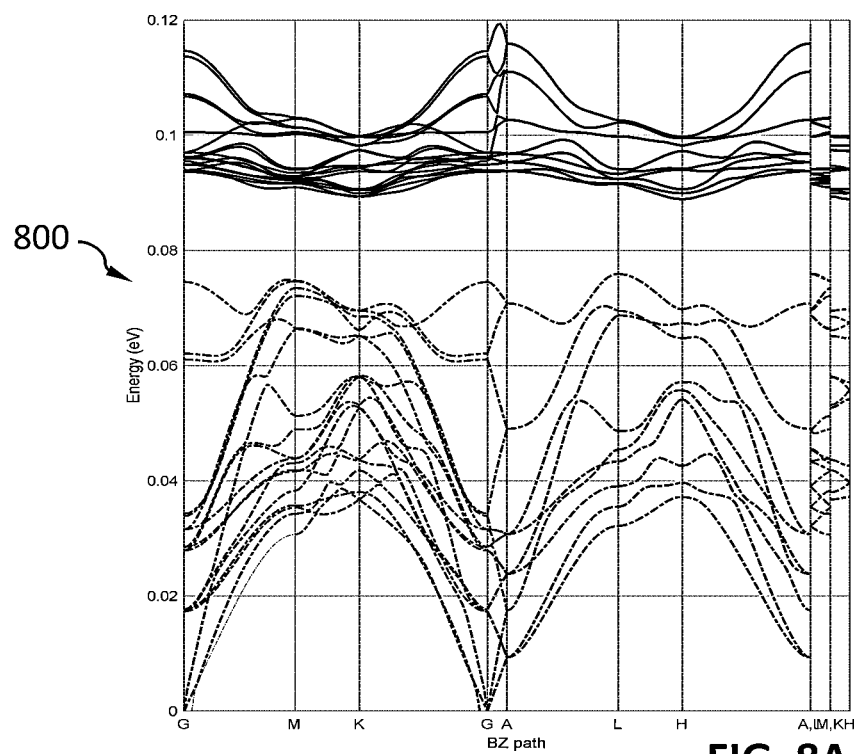
FIGS. 8A and 8B are plots of the phonon band structure and associated density of states, respectively, for single crystal SiC.
Figure 8B:
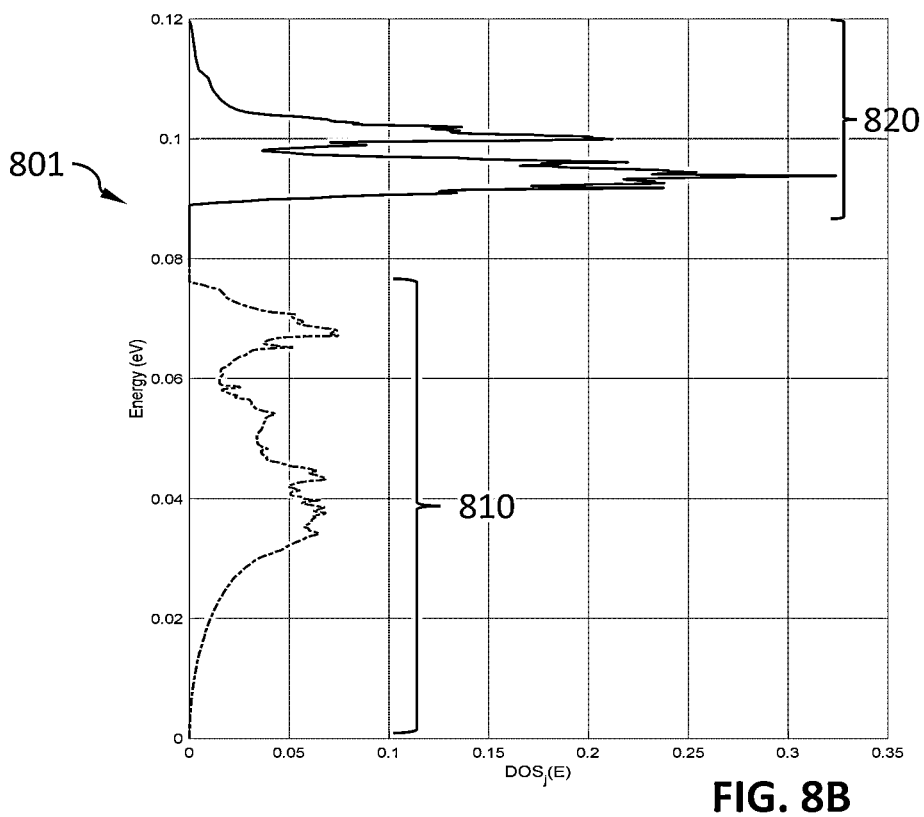

FIGS. 8A and 8B model the phonon band structure for single crystal SiC (4H-SiC in this example) in plot 800 and the associated density of states in diagram 801. The single crystal model provides insight to the optoelectronic behavior of large-scale single crystal material, polycrystalline material having misoriented grains, or sintered powders. Diagram 801 shows that single crystal SiC has an acoustic phonon branch 810 and an optical phonon branch 820. In an acoustic mode (acoustic phonons), atoms in a lattice move together similar to a sound wave when the movement is in the direction of propagation. In an optical mode (optical phonons), the atoms move out-of-phase with each other, which is advantageously used for radiative heating in this present disclosure. FIG. 8B shows that optical phonon branch 820 is located in the mid-infrared region, being centered around approximately 0.1 eV which corresponds to 12.4 μm. The optical phonon branch 820 indicates that SiC emits photons in the mid-IR band, which is beneficially utilized in the present disclosure for radiative heating of a WBG substrate that has an optical phonon absorption band that overlaps with the emission wavelengths of the SiC heater. Phonons are heat quanta intrinsic to the crystal structure and are shown herein to have mid-infrared properties advantageous for application as an infrared emitter upon suitable electronic excitation.

Figure 9:
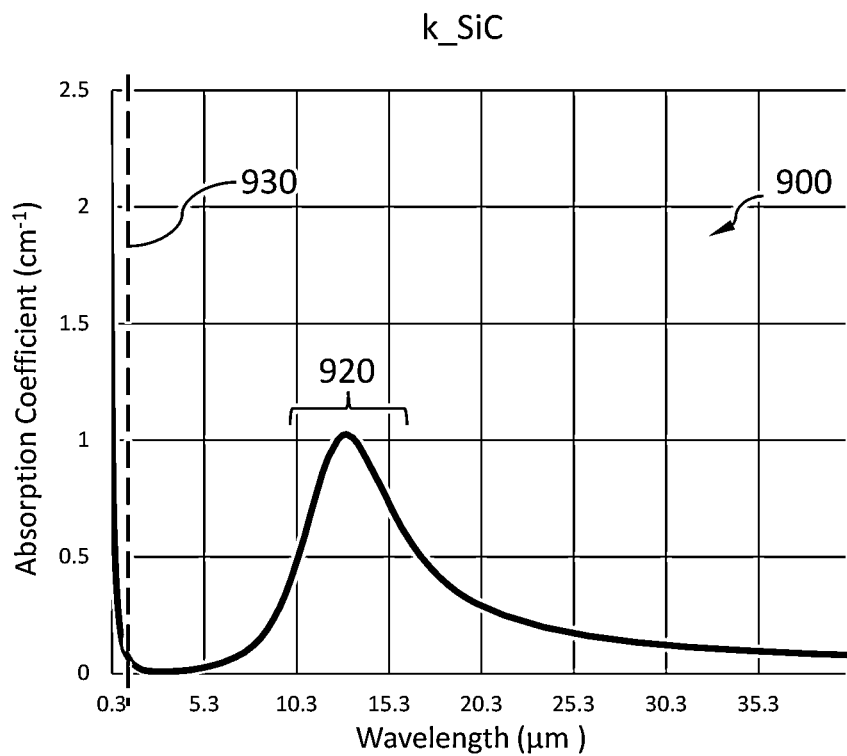
FIG. 9 is a plot of the absorption coefficient of SiC as a function of wavelength, showing the phonon absorption wavelength region, in accordance with some embodiments.

Referring now to FIG. 9, there is shown a plot 900 in which the absorption coefficient ($cm^{-1}$) of single crystal SiC was modeled as a function of wavelength (μm). The absorption coefficient represents the attenuation of radiation as it passes through a slab of the material. Plot 900 illustrates the phonon absorption corresponding to the optical phonon states illustrated in FIGS. 8A and 8B. In particular, the phonon absorption 920 in a wavelength range around 10-15 μm corresponds to the optical phonon state 820 illustrated in FIG. 8B. FIG. 9 also shows a below-bandgap absorption region 930 for wavelengths less than approximately 0.5 μm.

Figure 10:
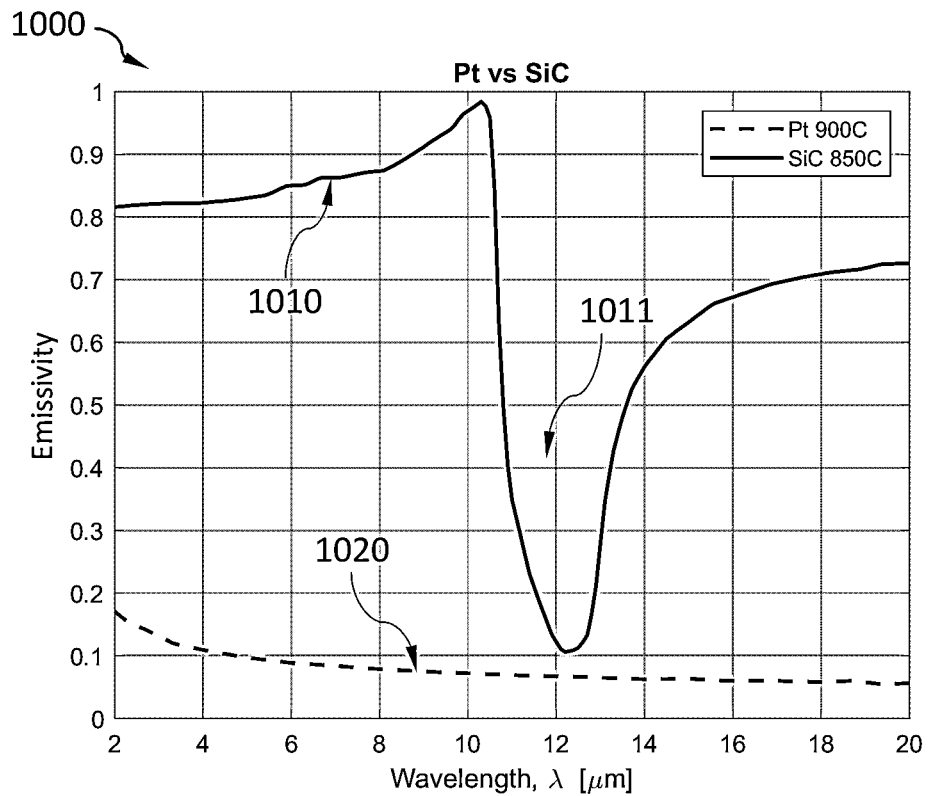
FIG. 10 is a plot of the emissivity of SiC as compared to the emissivity of conventional platinum, in accordance with some embodiments.

Properties of SiC as an example of a WBG semiconducting material for heaters of the present disclosure are shown in FIG. 10, in comparison to a conventional heating material. Plot 1000 of FIG. 10 shows the emissivity of SiC 1010 as a function of wavelength (μm) at 850° C. as compared to the emissivity of platinum 1020 (Pt, a conventional refractory metal) at 900° C. As can be seen, the emissivity of Pt 1020 is lower than that of SiC 1010. The emissivity of SiC 1010 also exhibits a valley 1011 centered around approximately 12 μm that is due to the valley near 0.1 eV in the optical phonon branch 820 of FIG. 8B. As can be seen by FIG. 10, the resistive heating materials have phonon-based emittance that is in the mid-IR range. The emissivity of $Ga_2O_3$ will be similar to that of SiC but shifted slightly with the phonon absorption band to longer infrared wavelengths.

Figure 11:
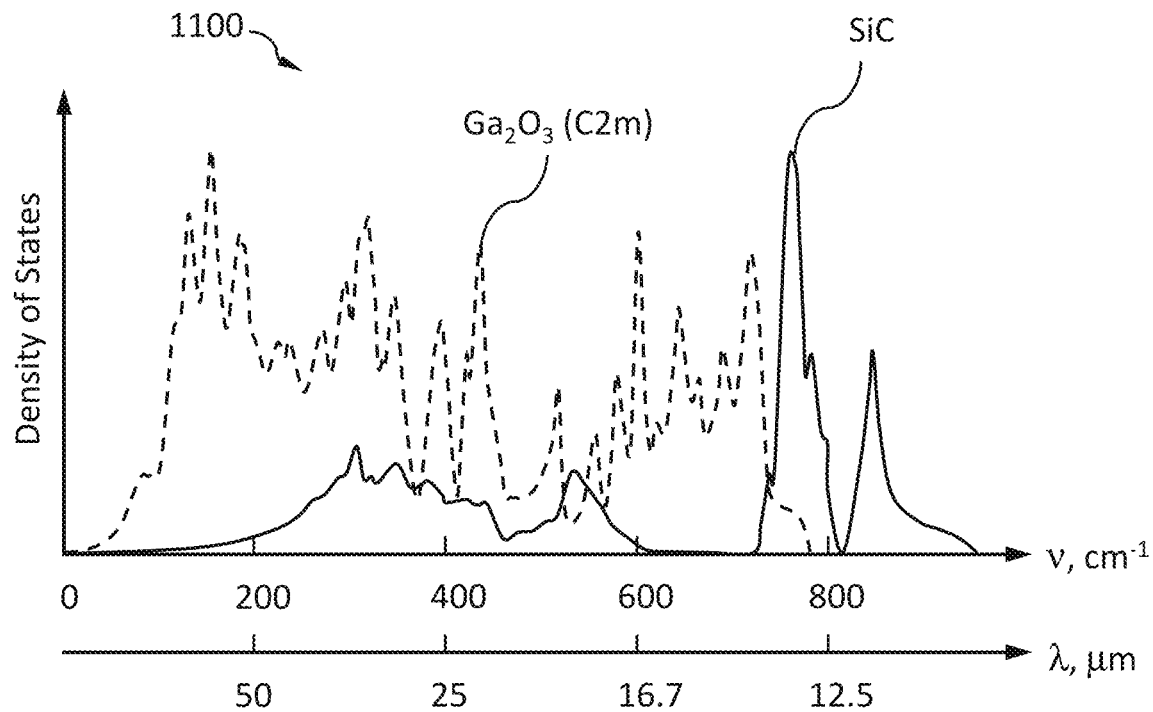
FIG. 11 is a plot of density of states as a function of wavelength or frequency, showing the overlap of SiC with a WBG substrate in the form of $Ga_2O_3$ (C2m), in accordance with some embodiments.
Figure 12:
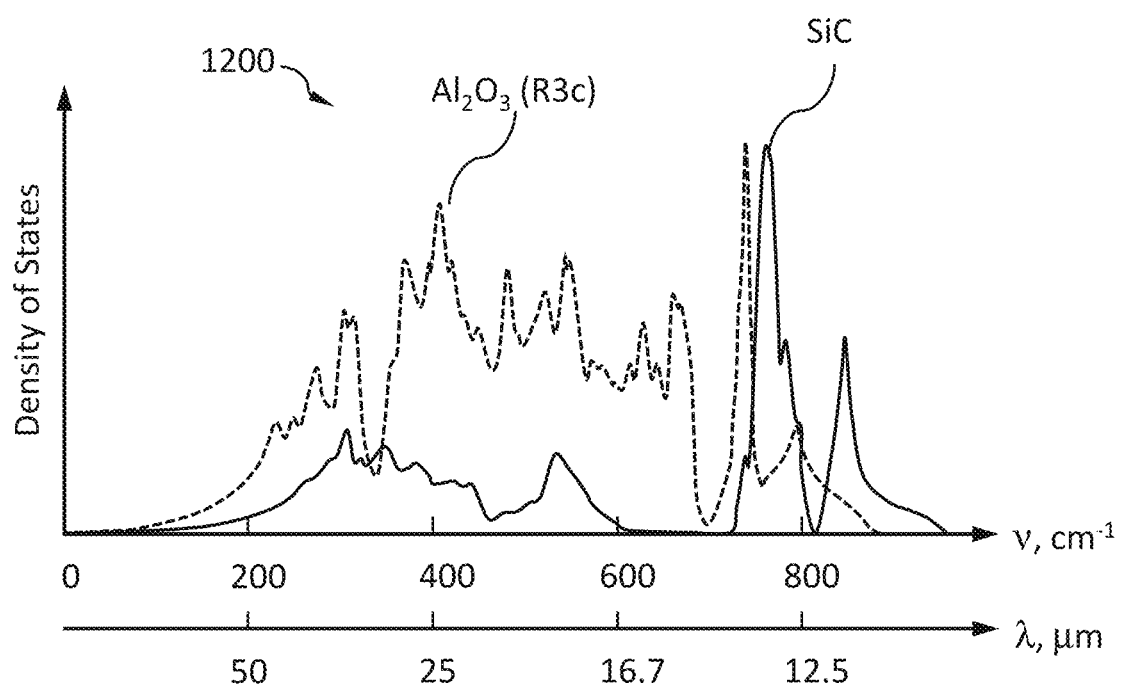
FIG. 12 is a plot of density of states as a function of wavelength/frequency, showing the overlap of SiC with a WBG substrate in the form of $Al_2O_3$(R3c), in accordance with some embodiments.

Comparison of properties between SiC as a resistive heating element and example WBG substrate materials are provided in FIGS. 11 and 12. Plot 1100 of FIG. 11 and plot 1200 of FIG. 12 show phonon density of states that were modelled as a function of frequency in inverse cm ($cm^{-1}$) or wavelength in microns (μm). Plot 1100 is a diagram showing the density of states for a WBG substrate in the form of $Ga_2O_3$ (space group C2m), and plot 1200 is a similar diagram for $Al_2O_3$ (space group R3c). Both plots 1100 and 1200 show the overlap of the substrate material with the density of states of SiC. In plot 1100, the overlap between SiC and $Ga_2O_3$ commences at approximately 12.5 μm, with further overlap occurring at longer wavelengths in the mid-infrared range (mid-infrared being approximately 12-40 μm). Similarly, in plot 1200, the overlap between SiC and $Al_2O_3$ commences at approximately 12.0 μm and continues into the mid-infrared range. From these figures it is seen that the phonon dependent optical emission from SiC provides radiative heating that can be absorbed by the WBG substrates of $Ga_2O_3$ and $Al_2O_3$.

As can be seen from this disclosure, methods and systems for radiatively heating WBG substrates enable heating the substrates without needing a back side coating or a backing plate as is typically used to couple the substrates with radiation from conventional refractory metal filament heating arrangements. Another important advantage is that a resistive heating element material (e.g., SiC) in accordance with the present disclosure may be selected to have enhanced oxidation resistance at high temperatures. Oxidation resistance is an important characteristic of a heating element for deposition environments where the use of oxygen or oxygen plasmas forms a component or step of the deposition process such as in the deposition of epitaxial oxides, e.g., metal oxides.

Embodiments of the present heating systems also include heating arrangements and control systems to ensure uniform and consistent heating of the WBG substrates. Uniform heating across the deposition surface of the substrate is important for achieving proper formation and uniform thicknesses of the layers being grown. Heating systems of the present disclosure in some embodiments involve resistive heaters having multizone heating elements configured to radiatively heat WBG substrates, and control systems that beneficially provide feedback to the heaters based on temperatures sensed from the deposition surface of the substrate rather than on the temperature of the heater itself as in conventional systems.

Figure 13:
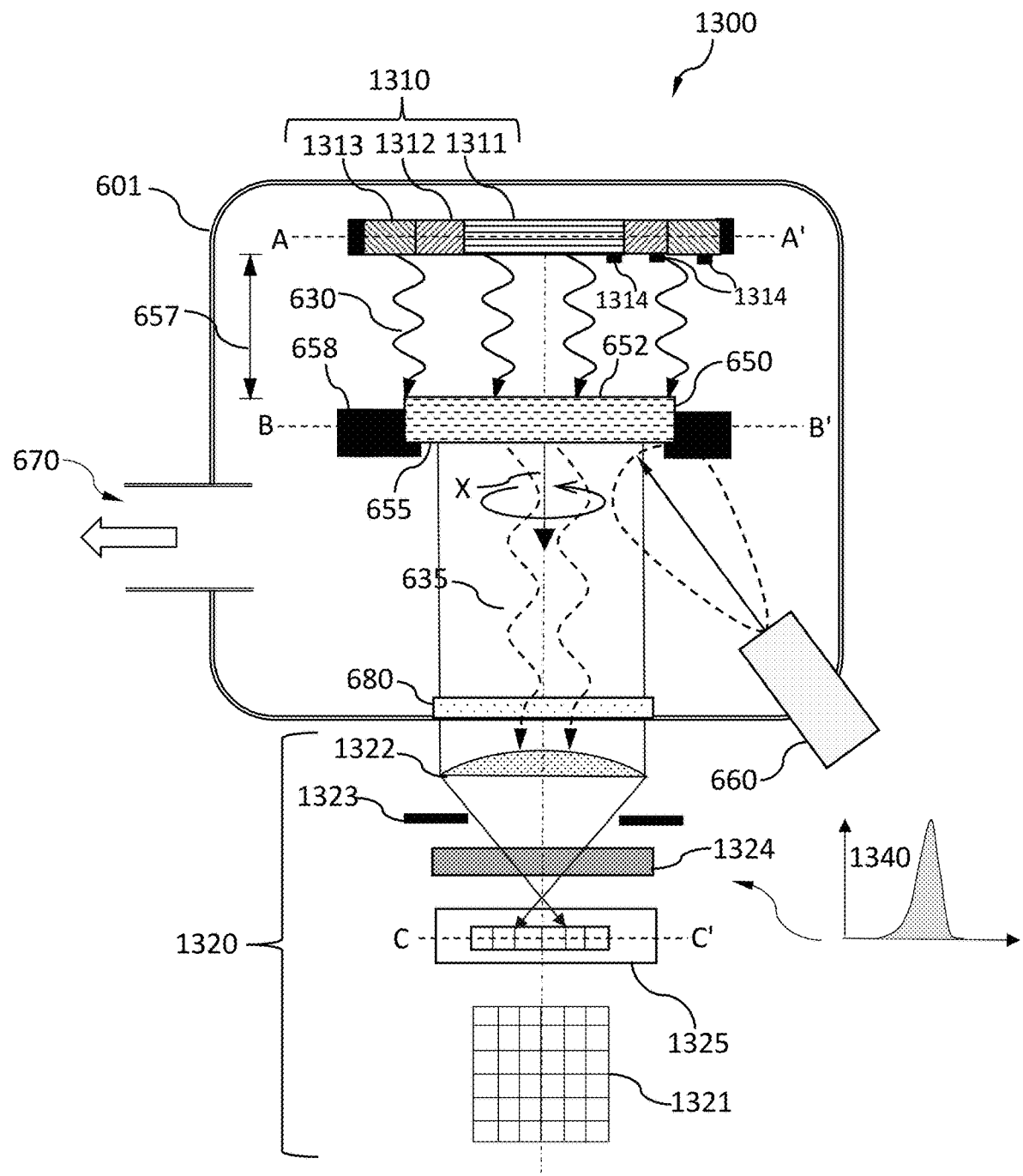
FIG. 13 is a schematic diagram of a heating control system used in conjunction with the substrate heating system illustrated in FIG. 6, in accordance with some embodiments.

FIG. 13 shows a figurative diagram of a heating control system 1300 that may be used in conjunction with heating system 600 of FIG. 6, in accordance with some embodiments. Reference numbers and associated description from FIG. 6 apply to FIG. 13 as well. Heating control system 1300 comprises a multizone resistive heater 1310 comprising two or more individually controlled resistive heating elements arranged in two or more zones. In this embodiment, resistive heater 1310 comprises a first resistive heating element in a central circular resistive heating zone 1311, and second and third resistive heating elements in two outer annular resistive heating zones 1312 and 1313, respectively. The amount of current delivered to each resistive heating zone 1311, 1312 and 1313 may be individually controlled. Each resistive heating element is chosen to be made of a material having an emissivity in a wavelength band designed to match the phonon absorption of a WBG substrate, such as a metal oxide substrate.

In this embodiment, multizone resistive heater 1310 comprises individual thermocouples 1314 for each of the heating zones 1311, 1312, 1313. Thermocouples 1314 are configured to measure the temperatures directly in front of each heater zone and are used to provide closed loop control feedback to the heater power sources to achieve a desired temperature for the respective heater zone.

Figure 14:
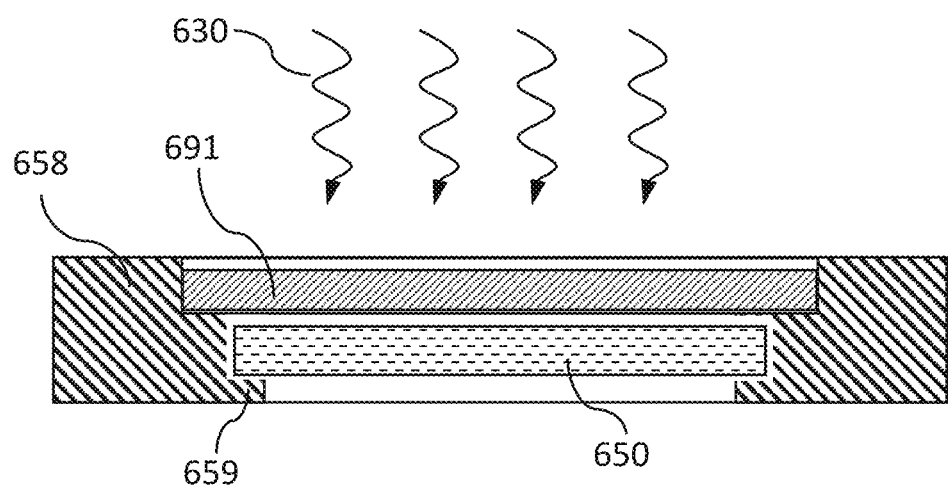
FIG. 14 is a schematic side view of a substrate holder configuration, as known in the art.

Heating control system 1300 further comprises pyrometer 1320 which is a measurement system that functions to individually control the heating zones 1311, 1312, 1313 in order to achieve a desired temperature profile across the deposition surface 655 of the substrate 650. Pyrometer 1320 monitors the temperature profile of deposition surface 655 during the heating process, not the temperature of the resistive heater. In conventional practices, it is typically overlooked that even if a spatially uniform temperature is achieved across the surface of the resistive heater, subsequent effects can dramatically alter the temperature distribution across the substrate. Pyrometry measurements performed in relation to the present disclosure discovered that edge effects and optical shadowing of incident radiation, due to the substrate holder, cause non-uniform heating across the substrate even if the temperature profile imparted by the resistive heater is uniform. For example, as shown in FIG. 14, a supporting lip 659 of the substrate holder 658 can cause edge effects and optical shadowing that result in non-uniform heating of the substrate 650 even if the impinging radiation 630 is uniform. A backing plate 691 can remove edge effects but can affect the overall temperature that can be achieved when heating the substrate. Reducing the overall temperature of the substrate can hinder the ability to achieve the high temperatures needed for layer deposition. Backing plate 691 can also cause a temperature differential from the center to the edge of the substrate 650, even though edge effects may not be present.

Returning to FIG. 13, pyrometer 1320 is advantageously configured to determine the temperature distribution of the deposition surface 655. The temperatures are measured remotely by receiving radiation emitted by the deposition surface 655 and transmitted through viewport 680. The pyrometer 1320 measures radiation emitted from different locations across the deposition surface using a two-dimensional camera or detector array 1325, comprising a rectangular array of pixels 1321 in this embodiment. Pyrometer 1320 includes detector array or camera 1325 as well as optical components (e.g., focusing optics) comprising at least one of a lens 1322, an aperture 1323 and an optical filter 1324. Radiation 635 emanating from the deposition surface 655 of substrate 650 is imaged onto detector array or camera 1325 via the focusing optics. Aperture 1323 can optionally be used to help set the field of view of the optics. Optical filter 1324 is configured to permit a particular wavelength range to pass through, such as by using a low-pass, high-pass or band-pass filter. For example, optical filter 1324 may be configured to select a specific wavelength range 1340, enabling the broadband detector array 1325 to be wavelength-sensitive to only the wavelength range 1340. To measure temperatures of WBG substrates in accordance with embodiments of the present disclosure, optical filter 1324 selectively allows optical radiation in the desired detection range (e.g., mid-infrared band) to pass through. For example, the wavelength range 1340 may be selected to be 5-20 μm, or 6-15 μm, or 6-9 μm. In some embodiments, the optical filter 1324 may be dynamically tuned to a specific wavelength range. The imaged substrate can then be analyzed spatially as a function of wavelength and referenced against the blackbody spectrum to determine a spatial temperature profile of the substrate. In some cases, this temperature profile can be built up from a plurality of wavelength-specific filters. In some embodiments, a single detector with a lens can be used to focus on a small portion of the wafer surface. The detector and lens can scan the wafer surface to determine the temperature profile across the substrate. For example, the lens and detector may be initially oriented to image the center of wafer. The detector and lens can then be tilted to scan the wafer radially from the center of the wafer to the edge of the wafer while the substrate is rotating, to build a radial map of the pyrometer signal.

Figure 15A:
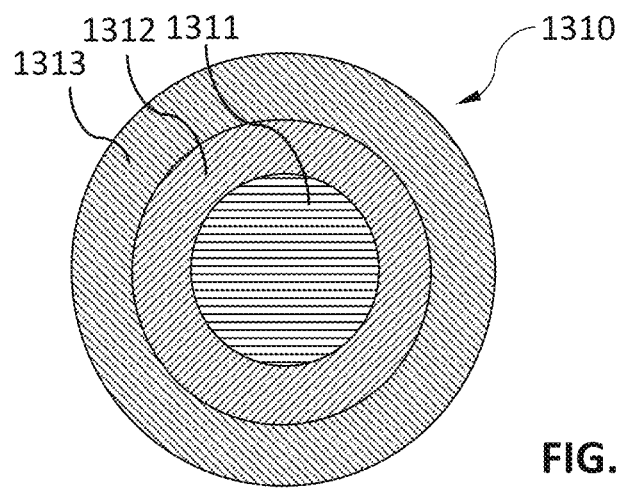
FIGS. 15A, 15B and 15C are cross-sectional views of section A-A', section B-B', and section C-C' of FIG. 13, in accordance with some embodiments.
Figure 15B:
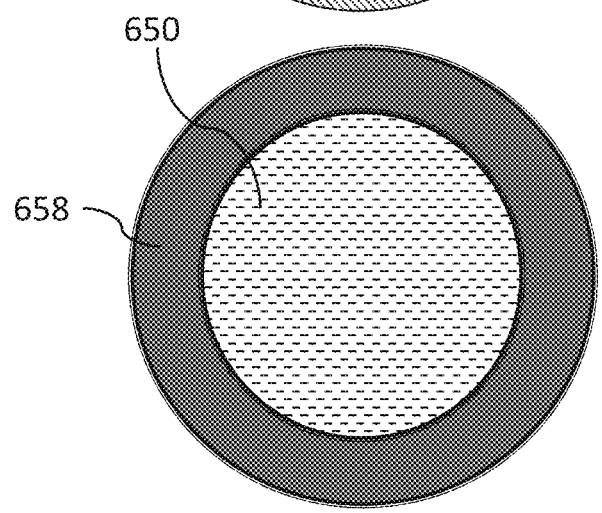
Figure 15C:
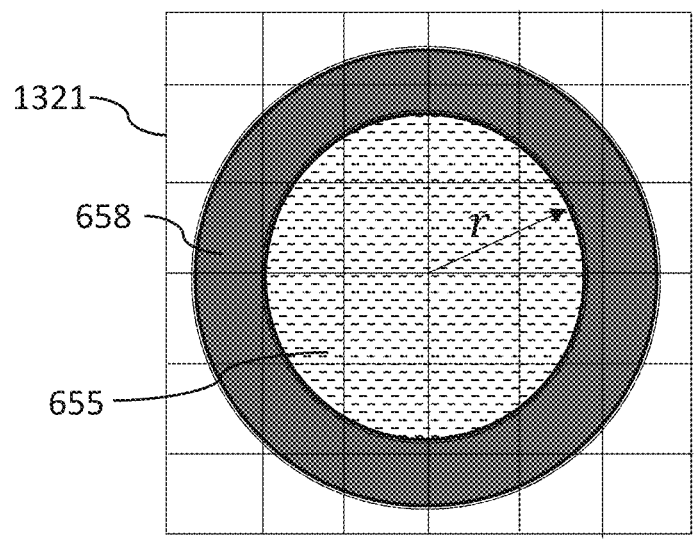

FIGS. 15A, 15B and 15C show cross-sectional views through section A-A', section B-B' and section C-C', respectively, of FIG. 13. Section A-A' is of multizone resistive heater 1310, section B-B' is of substrate 650 and substrate holder 658, and section C-C' is of detector array 1325. As can be seen in section C-C' (FIG. 15C), the array of pixels 1321 of detector array 1325 receives an image of the entire substrate holder 658 and deposition surface 655. An individual pixel in the array of pixels 1321 may be correlated to a corresponding location on the deposition surface 655. Measurements of intensity at an individual pixel in wavelength range 1340 may be correlated to the temperature at the corresponding location in accordance with the Stefan-Boltzmann relationship to obtain a remotely determined temperature distribution across the substrate holder 658 and deposition surface 655. For a rotating substrate 650, the temperature distribution will be a function of the distance r from the rotational axis and have the form T(r). In this manner, the heating control system 1300 measures a plurality of temperatures across the deposition surface 655 of the substrate 650, based on the optical radiation received through the optical filter 1824.

The temperatures measured by the pyrometer are provided as feedback to the resistive heater 1310. The feedback comprises the plurality of temperatures, to control the two or more individually controlled resistive heating elements in heating zones 1311, 1312 and 1313. For example, temperatures corresponding to a central portion of the deposition surface 655 may be used to adjust the resistive heating element of the central heating zone 1311. Similarly, temperatures corresponding to locations further away from a center of the deposition surface 655 may be used to adjust the resistive heating element of a corresponding annular heating zone 1312 or 1313. In some embodiments, the temperature feedback from the pyrometer 1320 may be used in conjunction with feedback from the thermocouples 1314 to control the multizone resistive heater 1310. For example, power settings of the multizone resistive heater 1310 can be controlled according to desired temperature setpoints for the heating elements using feedback from the thermocouples 1314, where the temperature setpoints for each heating zone (1311, 1312, 1313) can be based on feedback from the substrate surface temperature per pyrometer 1320. In other words, the pyrometer-based measurements of the substrate 650 can serve as an active feedback loop on top of the feedback loop between thermocouples 1314 and multizone resistive heater 1310. By measuring the temperature of the deposition surface 655, the heating control system 1300 accurately achieves a desired temperature profile on the surface where material growth occurs, rather than being based on temperatures of the resistive heater 1310 which may not properly capture the substrate temperature. Furthermore, the multizone configuration of the resistive heater 1310 enables temperatures to be adjusted at specific locations, which beneficially helps to ensure that a desired temperature profile is maintained (e.g., uniform profile across the surface).

Embodiments of a system for radiatively heating a substrate in a vacuum deposition process as described in FIG. 13, FIGS. 15A-15C, and throughout this disclosure include a vacuum deposition chamber that operates at a high or ultra-high vacuum, such as a pressure less than or equal to $5 \times 10^{-4}$ Torr. A resistive heater is in the vacuum deposition chamber, where the resistive heater generates radiative heat having a wavelength in a mid-infrared band of 5 μm to 40 μm that corresponds to a phonon absorption band of a substrate. The resistive heater comprises two or more individually controlled resistive heating elements arranged in two or more zones. The system includes a substrate holder for holding the substrate in the vacuum deposition chamber. The substrate comprises a wide bandgap (WBG) semiconducting material, the substrate having an uncoated surface and a deposition surface opposite the uncoated surface. The substrate holder is configured to position the uncoated surface to be spaced apart from and facing the two or more individually controlled resistive heating elements to receive the radiative heat. The uncoated surface of the substrate is directly heated by absorbing the radiative heat. The system may also include a heating control system comprising a pyrometer. The heating control system comprises an optical filter that selectively allows optical radiation in the mid-infrared band to pass through. The heating control system measures a plurality of temperatures across the deposition surface of the substrate, based on the optical radiation through the optical filter. The heating control system provides feedback to the resistive heater, the feedback comprising a signal including the plurality of temperatures, to control the two or more individually controlled resistive heating elements.

In embodiments of systems for radiatively heating a substrate, the two or more individually controlled resistive heating elements are resistant to oxidation as described herein. For example, the resistive heating elements may comprise SiC, where the SiC may be n-type doped in some embodiments. The SiC for the resistive heating element may be single crystal or polycrystalline, and may be of various polytypes such as, but not limited to, 3C-SiC, 2H-SiC, 4H-SiC or 6H-SiC. In another example, the two or more individually controlled resistive heating elements may comprise $Ga_2O_3$, where the $Ga_2O_3$ may be coated with SiC and/or may be n-typed in some embodiments. The Si $Ga_2O_3$ for the resistive heating element may be single crystal or polycrystalline.

In some embodiments, the WBG semiconducting material of the substrate being radiatively heated by the systems of the present disclosure is an oxide and has a bandgap from 3 eV to 9 eV. In some embodiments, the WBG semiconducting material of the substrate comprises $Al_2O_3$, $Ga_2O_3$, SiC (e.g., 3C—SiC, 2H—SiC, 4H—SiC or 6H—SiC or other polymorphs), MgO, LaAlO$_3$, $Gd_3Ga_5O_{12}$, $MgF_2$, LiF, $MgGa_2O_4$, or $CaF_2$.

Figure 16:
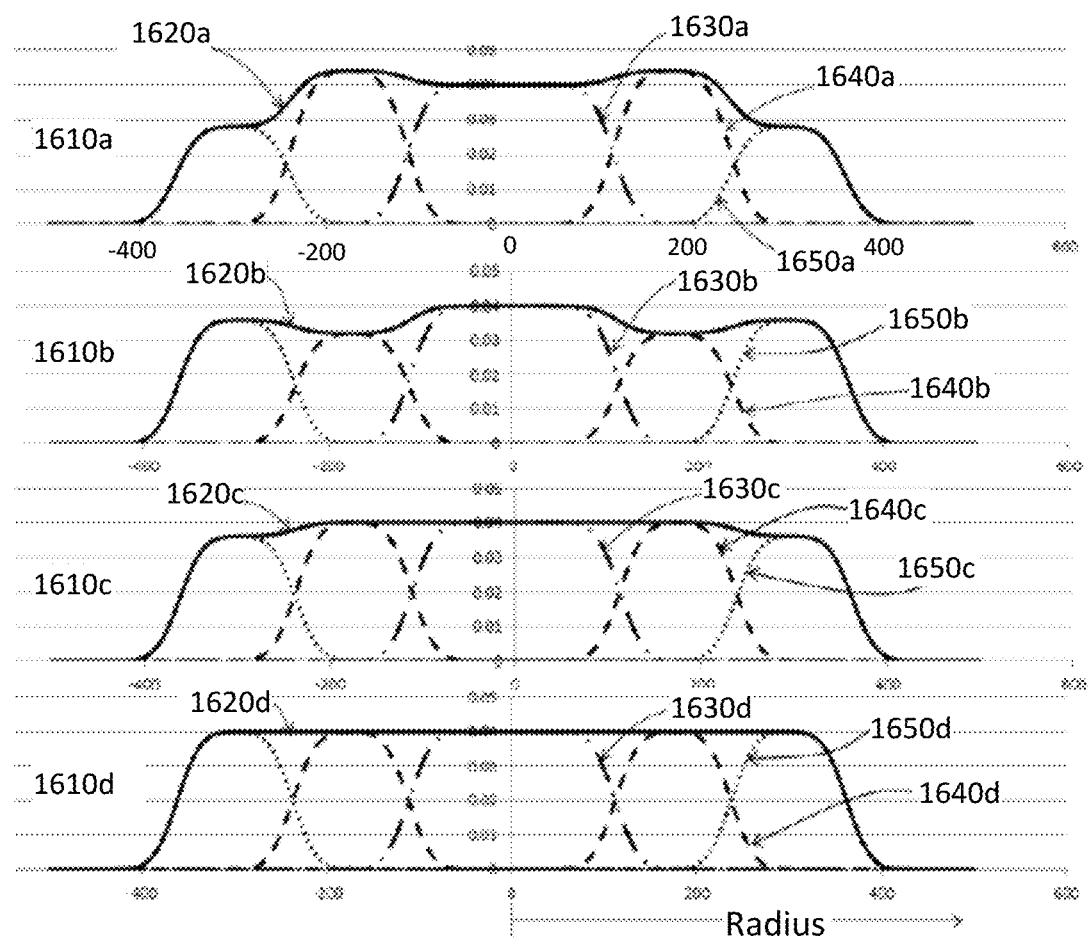
FIG. 16 shows a series of substrate temperature profiles due to feedback from a multizone heating control system, in accordance with some embodiments.

FIG. 16 demonstrates achieving a substrate desired temperature profile with multizone heating control system 1300. In FIG. 16, plots 1610a, 1610b, 1610c and 1610d show various substrate temperature profiles 1620a, 1620b, 1620c and 1620d that may be achieved using temperature feedback from the pyrometer 1320. Each plot shows temperature as a function of radius, and each temperature profile (arbitrary y-axis units) is a composite of the three individually controlled resistive heating zones of resistive heater 1310. For example, temperature profile 1620a is a compilation of central heating zone 1630a, intermediate annular zone 1640a and outer annular zone 1650a. Similarly, temperature profiles 1620b-d are a result of central heating zones 1630b-d, intermediate annular zones 1640b-d and outer annular zones 1650b-d, respectively. As can be seen, the respective contributions of the individually controlled resistive heating zones (e.g., 1630b, 1640b and 1650b in plot 1610b) may be individually controlled or compensated to achieve the desired overall temperature profile. In one embodiment, temperature feedback is provided to the individually controlled heating zones by the pyrometer 1320 in a time progression from plot 1610*a* to 1610*d*. In such an embodiment, the final temperature profile 1620*d* is desired to be flat—that is, uniform across the substrate surface. In other embodiments, the desired temperature profile may be any of the plots 1610*a-d*. For example, the target temperature profile may not necessarily be flat but may be any desired radial profile such as having a higher temperature in the middle annular zone (e.g., plot 1610*a*), or a lower temperature in the middle annular zone compared to the central zone and outer annular zone (e.g., plot 1610*b*), or a relatively uniform temperature in the central zone and middle annular zone (e.g., plot 1610*c*).

Figure 17:
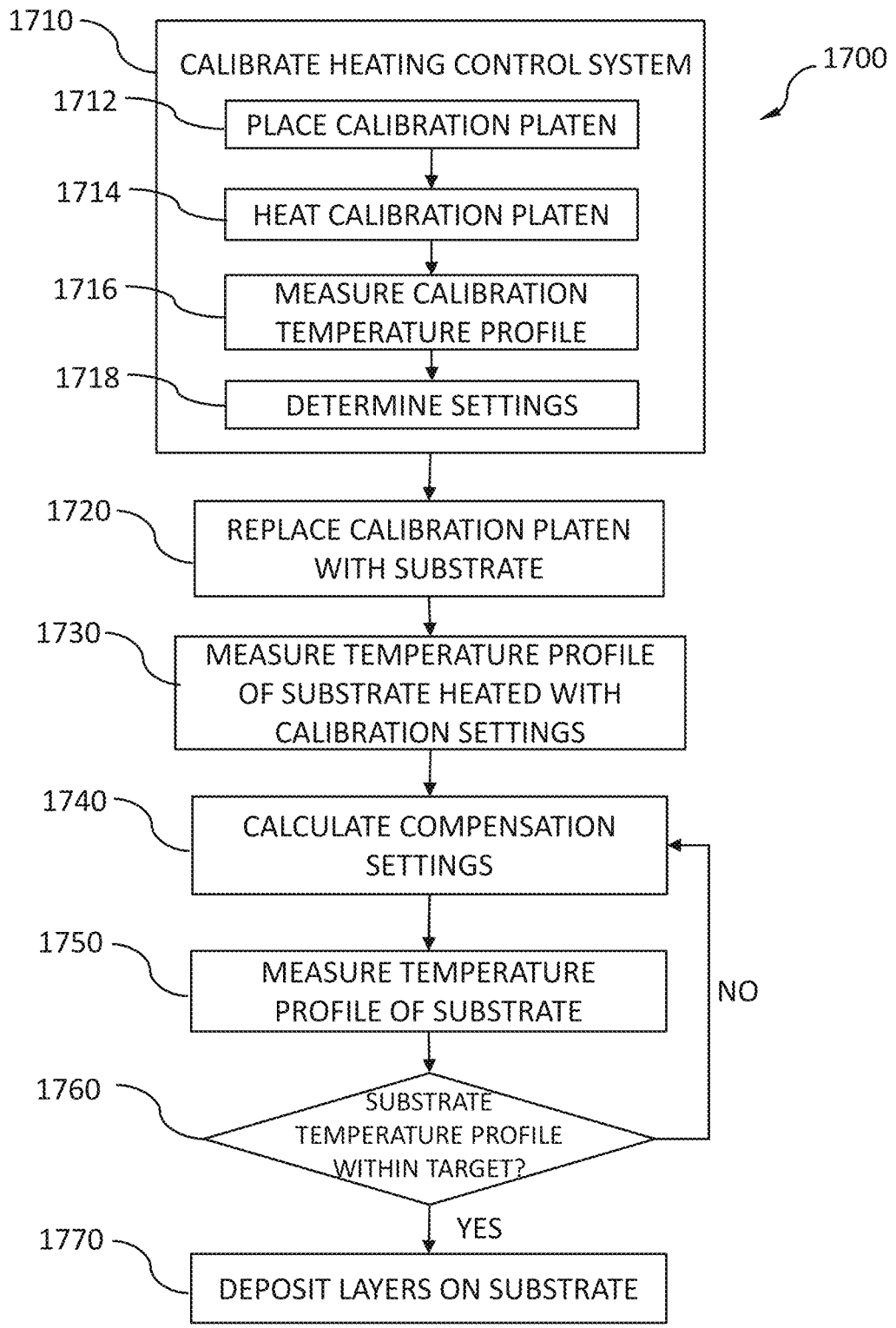
FIG. 17 is a flowchart of methods for controlling the heating of a substrate to achieve a desired temperature profile, in accordance with some embodiments.

FIG. 17 is a flowchart of a method 1700 for controlling the heating of a substrate to achieve a desired temperature profile for the deposition surface, and for depositing an oxide on the substrate. Method 1700 may be implemented with the heating control system 1300 described in FIG. 13. The method utilizes a calibration platen in some embodiments to determine initial settings for the heater, then calculates compensation parameters when heating a WBG substrate during the actual deposition process.

At block 1710, the individually controlled resistive heating zones are calibrated using a calibration platen instead of a working substrate 650, where the calibration platen is made of a bulk material and is shaped and sized similar to the substrate. In general, the temperature profile $T_c$ of the calibration platen is described by $T_c(P_{i=1, \ldots N}, R, \varepsilon_P)$ where $P_i$ are compensation settings for each heating zone, N is the number of heating zones, R is radius, and $\varepsilon_P$ is the emissivity of the platen. In the multizone resistive heating element 1310 shown in FIG. 13, the number of zones N would be 3. By using a bulk material platen, the temperature profile $T_c$ is only a function of the emissivity $\varepsilon_P$ of the platen, and the measured temperature profile is determined by $T_c(P_{i=1, \ldots N}, R, \varepsilon_P)=T_c(\varepsilon_P)$. Block 1710 involves, in block 1712, placing a calibration platen where the substrate will be positioned; that is, spaced apart from the resistive heater. Block 1710 also involves heating the calibration platen (block 1714) with the resistive heater; measuring the calibration temperature profile $T_c$ of the heated calibration platen (block 1716); and determining settings for the resistive heater based on the calibration temperature profile (block 1718). In one embodiment, initial settings may begin with the resistive heaters in all the heating zones being at the same power or current. In some embodiments, calibration of the settings may include establishing power levels for and power ratios between the resistive heating elements of the different zones of the resistive heater 1310, that achieve a particular temperature profile on the calibration platen. Block 1710 is performed prior to generating radiative heat to heat the working substrate 650.

In other embodiments of block 1710, the calibration platen can be omitted, and temperatures on the substrate surface can be measured using a calibrated pyrometer while the heater is operated with known drive parameters (e.g., current or voltage). The heater parameters can then be modified to achieve a uniform temperature profile across the wafer.

At block 1720, the bulk material calibration platen is replaced with the desired growth substrate for the deposition process. At block 1730, the substrate is heated using the settings of the individually controlled resistive heating zones determined by the calibration of block 1710, and the temperature profile of the substrate $T_S(P_{i=1, \ldots N}, R, \varepsilon_P)$ is measured.

Blocks 1740, 1750 and 1760 are a feedback control loop where initially at block 1740, compensation settings $P'_{i=1, \ldots N}$ for the individually controlled resistive heating zones for achieving the target (i.e., desired) substrate temperature profile $T'_S(R)$ are calculated. Calculating the compensation settings may include adjusting current or power for individual heating zones. As an example, temperatures nearer the edge of the rotating substrate may naturally become cooler than toward the center during the deposition process, and accordingly the compensation settings may increase the heat output for an outer annular heater of the multizone resistive heating system. Compensation settings may also include adjusting for a different behavior of the calibration platen material compared to the substrate material. The compensation settings are implemented and then in block 1750 the temperature profile of the substrate is measured again. At block 1760, a determination is made whether the measured temperature profile is suitably close to the target substrate temperature profile $T'_S(R)$, such as whether the temperature profile is within a threshold range of a desired setpoint. The determination in block 1760 is based on feedback from the pyrometer 1320 and may additionally utilize feedback from thermocouples 1314 of the resistive heater. If this threshold condition is met, then the deposition process of depositing layers on the substrate may proceed at block 1770. If the temperature profile is not within the desired range, the control loop returns to block 1740 to calculate new compensation settings for the individually controlled resistive heating zones.

Figure 18:
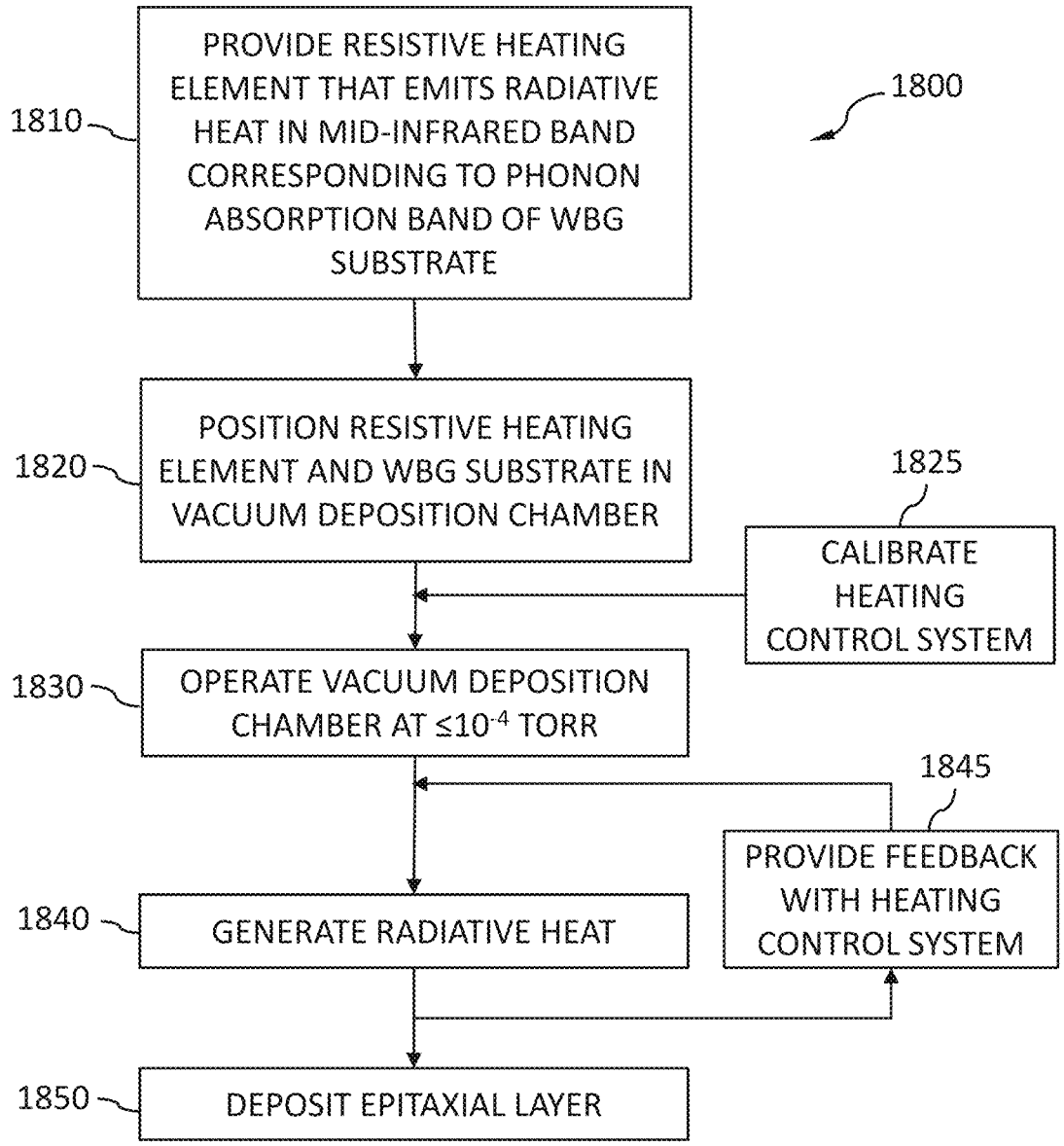
FIG. 18 is a flowchart of methods for radiatively heating a WBG substrate in a vacuum deposition process, in accordance with some embodiments.

FIG. 18 is a flowchart representing methods 1800 of heating a substrate in a vacuum deposition process. Block 1810 involves providing a resistive heater having a resistive heating element, where radiative heat emitted from the resistive heating element has a wavelength in a mid-infrared band from 5 μm to 40 μm that corresponds to a phonon absorption band of a substrate. The substrate comprises a wide bandgap (WBG) semiconducting material and has an uncoated surface and a deposition surface opposite the uncoated surface. Block 1820 involves positioning the resistive heating element and the substrate in a vacuum deposition chamber, where the uncoated surface of the substrate is spaced apart from and faces the resistive heating element. In block 1830 the vacuum deposition chamber is operated at a pressure less than or equal to $5 \times 10^{-4}$ Torr (i.e., vacuum higher than $5 \times 10^{-4}$ Torr). In block 1840, the radiative heat is generated from the resistive heating element, and the substrate is heated with the radiative heat. The uncoated surface of the substrate is directly heated by absorbing the radiative heat. The direct heating comprises the back surface of the substrate being exposed directly to radiative heat from the heater, without a coating on the back surface or without a backing plate between the substrate and the resistive heater. For example, the positioning of the substrate in block 1820 may involve mounting the substrate in a substrate holder, where the substrate holder is absent of a plate that absorbs the radiative heat to heat the substrate by conduction. In block 1850, one or more epitaxial layers are deposited on the deposition surface of the substrate, such as depositing an epitaxial oxide layer.

In some embodiments of block 1810 the resistive heating element is in the form of a multizone resistive heater. In such embodiments, block 1810 involves providing a resistive heater comprising two or more of the resistive heating elements, where the two or more of the resistive heating elements are individually controlled and arranged in two or more zones. The methods may also involve block 1845 of providing feedback to the resistive heater with a heating control system. The multizone resistive heater and the heating control system may be configured as described in FIG. 13. For example, the heating control system may comprise a pyrometer and an optical filter that selectively allows optical radiation in the mid-infrared band to pass through. The heating control system measures a plurality of temperatures across the deposition surface of the substrate, based on the optical radiation from the optical filter. The feedback comprises providing a signal to the resistive heater, the signal including the plurality of temperatures, to control the two or more individually controlled resistive heating elements.

Some embodiments may include block 1825 of calibrating the heating control system prior to generating radiative heat for heating the WBG substrate. The calibration of block 1825 may be performed as described in FIG. 17. For example, the calibration may include placing a calibration platen where the substrate will be positioned, heating the calibration platen with the resistive heater, measuring a calibration temperature profile of the heated calibration platen, and determining settings for the resistive heater based on the calibration temperature profile. After the calibrating, the methods 1800 may include replacing the calibration platen with the substrate, measuring the plurality of temperatures, and calculating compensation settings for the resistive heater as described in FIG. 17 and throughout this disclosure.

In embodiments of the methods 1800, the resistive heating element is resistant to oxidation as described herein. For example, the resistive heating element may comprise SiC, where the SiC may be n-type doped in some embodiments. The SiC for the resistive heating element may be single crystal or polycrystalline, and may be of various polytypes such as, but not limited to, 3C—SiC, 2H—SiC, 4H—SiC or 6H—SiC. In another example, the resistive heating element may comprise $Ga_2O_3$, where the $Ga_2O_3$ may be coated with SiC and/or may be n-typed in some embodiments. The Si $Ga_2O_3$ for the resistive heating element may be single crystal or polycrystalline.

In some embodiments of the methods 1800, the WBG semiconducting material of the substrate is an oxide and has a bandgap from 3 eV to 9 eV. In some embodiments, the WBG semiconducting material of the substrate comprises $Al_2O_3$, $Ga_2O_3$, SiC, MgO, $LaAlO_3$, $Gd_3Ga_5O_{12}$, $MgF_2$, LiF, $MgGa_2O_4$, or $CaF_2$.

Embodiments include semiconductor structures formed in accordance with the methods 1800 of FIG. 18, using the systems disclosed herein, where the semiconductor structures include a substrate comprising a wide bandgap (WBG) semiconducting material, and an epitaxial oxide layer on the substrate.

Figure 19:
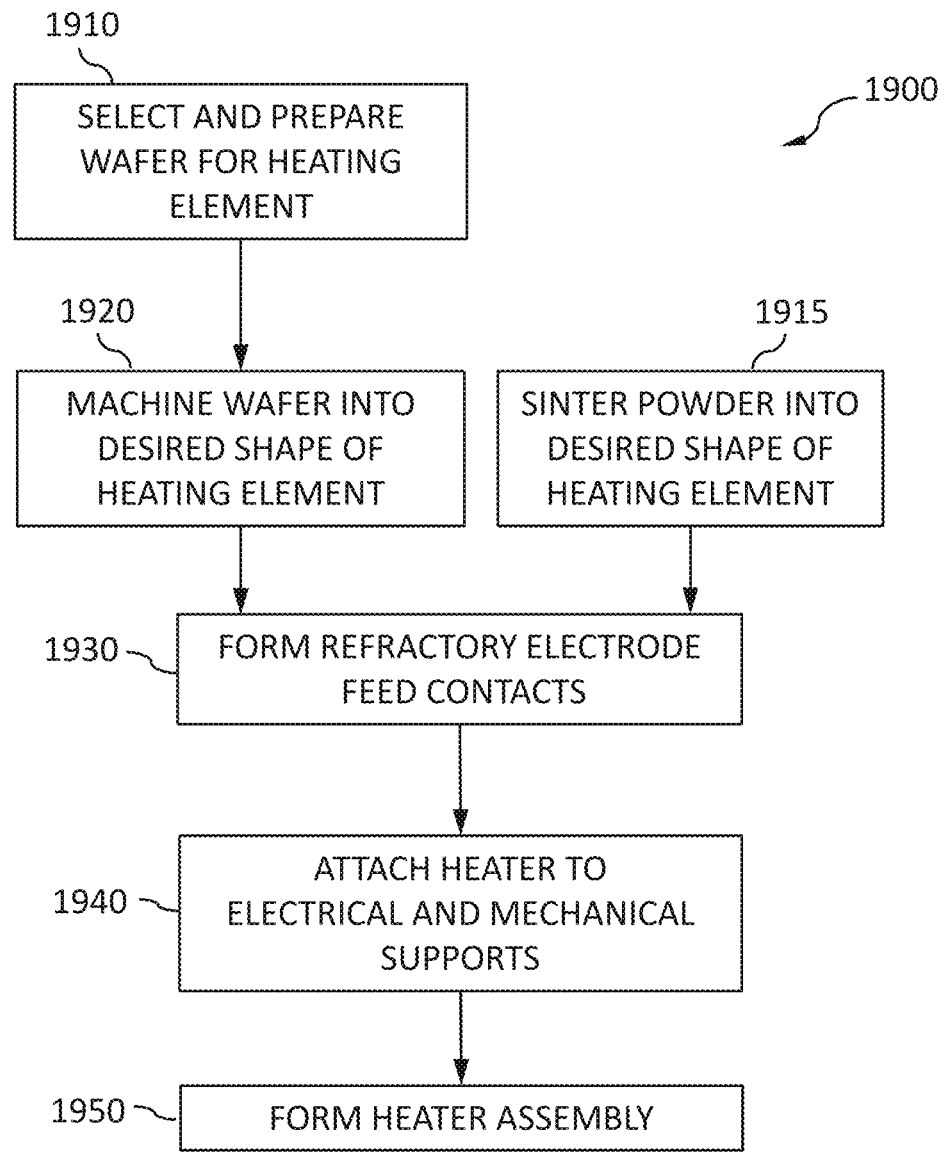
FIG. 19 is a flowchart of methods for manufacturing a resistive heater for heating a WBG substrate, in accordance with some embodiments.

FIG. 19 is a flowchart for methods 1900 of manufacturing a resistive heater in accordance with embodiments of the present disclosure. In block 1910, a wafer is selected and prepared for manufacturing into a resistive heating element of a resistive heater. The wafer may be single crystal or polycrystal and may be made of SiC (of any polymorph as described in this disclosure), $Ga_2O_3$, or any WBG semiconducting material as described herein. The wafer material may also be doped (e.g., n-type SiC or n-type $Ga_2O_3$) if needed in block 1910 to make the material electrically conductive to act as a resistive heater, as described in this disclosure. For single crystal material, the wafer may be grown from a single crystal starter crystal according to known processes. For polycrystal material, the wafer may be grown without being seeded by a single crystal starter crystal, according to known processes. In block 1920, the wafer is machined (e.g., laser cut) into the desired shape of the resistive heating element.

In other embodiments represented by block 1915, the heating element may be formed from a powder instead of from a wafer. For example, single crystal or polycrystalline powder may be sintered at high temperatures (e.g., 1000° C. to 1700° C.) to form a rigid, solid object (e.g., into a ceramic from SiC). In block 1915 the powder may be formed directly into the desired shape of the resistive heating element or may be formed into a shape close to the desired shape and then machined to create the final shape.

In block 1930, refractory electrode feed contacts are formed and coupled to the resistive heating element. For example, front and back contacts (electrodes) can be patterned onto a wafer or deposited onto a sintered part. In block 1940, the resistive heater comprising the resistive heating element and electrodes is attached to electrical and mechanical supports, to form a heater assembly in block 1950.

Figure 20:
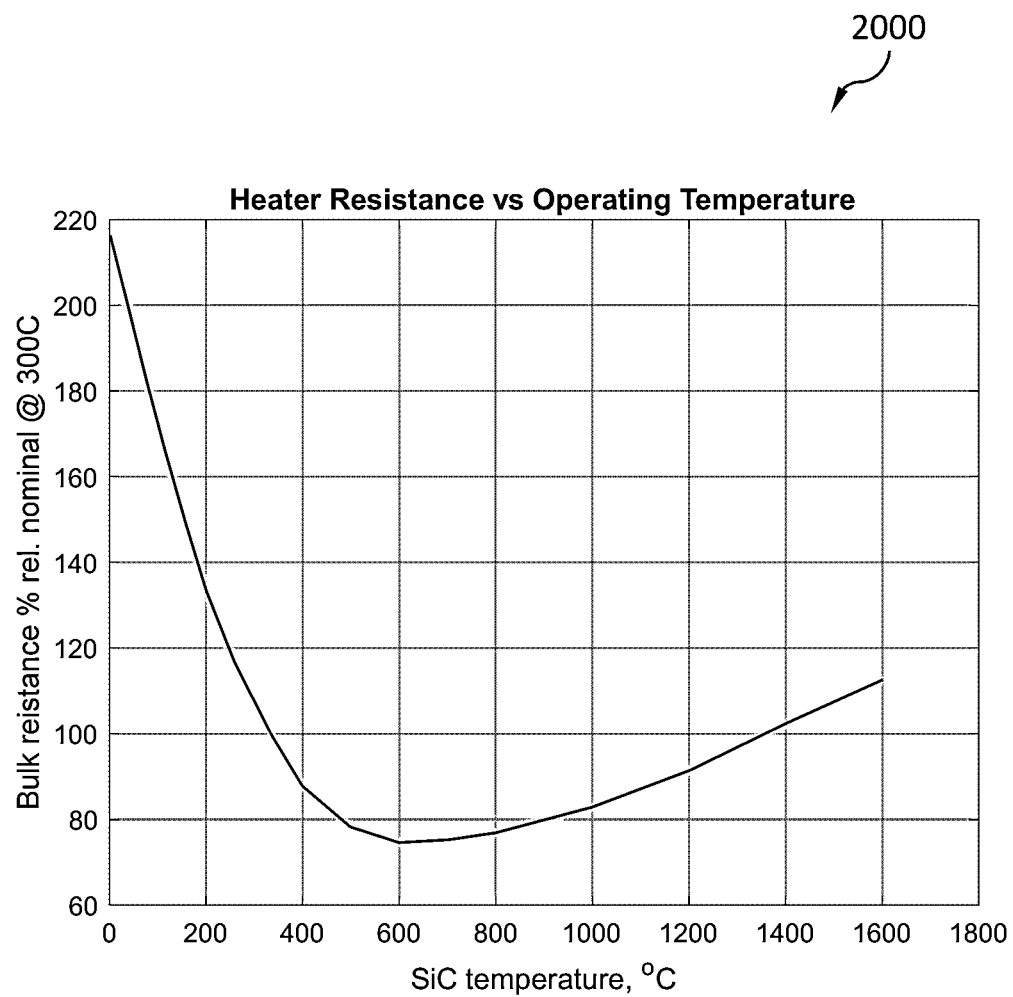
FIG. 20 is a graph of heater resistance as a function of operating temperature, in accordance with some embodiments.

FIG. 20 shows a graph 2000 of heater resistance as a function of operating temperature, using SiC as an example heater material. The y-axis is bulk resistance as a percentage, relative to a nominal value at 300° C. The graph 2000 shows that the electrical resistance of the heater material changes with temperature, where the dip in the curve is referred to as a negative differential resistance. Different designs of heating elements can be utilized in accordance with embodiments, to accommodate the variation in resistance with temperature for different resistive heater materials. The heating control system of FIG. 13 can also be configured to compensate for the resistance variation due to temperature.

FIGS. 21A-21G are plan views of configurations for resistive heating element designs of WBG semiconducting material heaters to radiatively heat WBG substrates, in accordance with some embodiments. The plan views of FIGS. 21A-21G are denoted by an X-Y plane. The shapes of the resistive heating elements can be formed in blocks 1915 or 1920 of FIG. 19. As can be seen, the heating elements are circular in their overall shape, corresponding to the circular shape of the substrate being heated. In these diagrams, locations marked A, B and C are electrical feed points, such as the electrode feed contacts formed in block 1930 of FIG. 19. The feed points are connected with electrodes (e.g., electrodes 610 of FIG. 6). The resistive heating elements are made of WBG semiconducting materials that emit radiative heat having wavelengths in a mid-infrared band (e.g., from 5 μm to 40 μm) that correspond to a phonon absorption band of a WBG substrate being heated, as described throughout this disclosure.

Figure 21A:
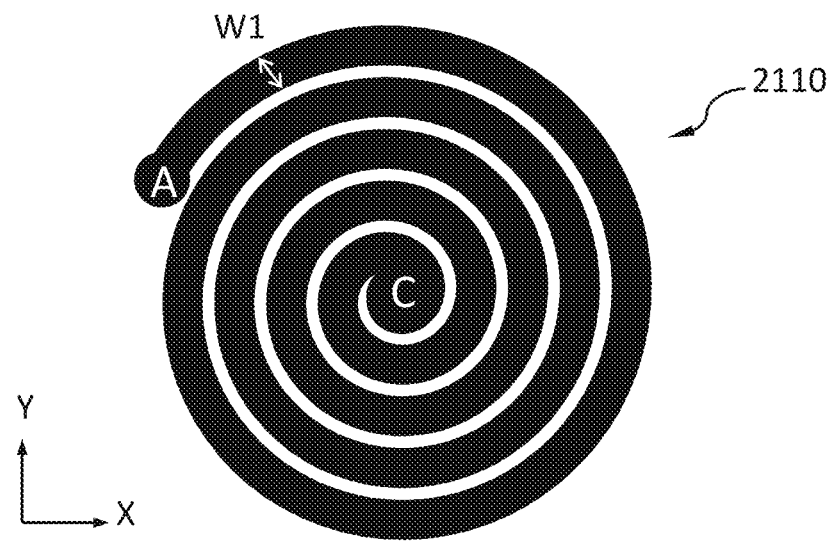
FIGS. 21A-21G are plan views of resistive heating element configurations, in accordance with some embodiments.
Figure 21B:
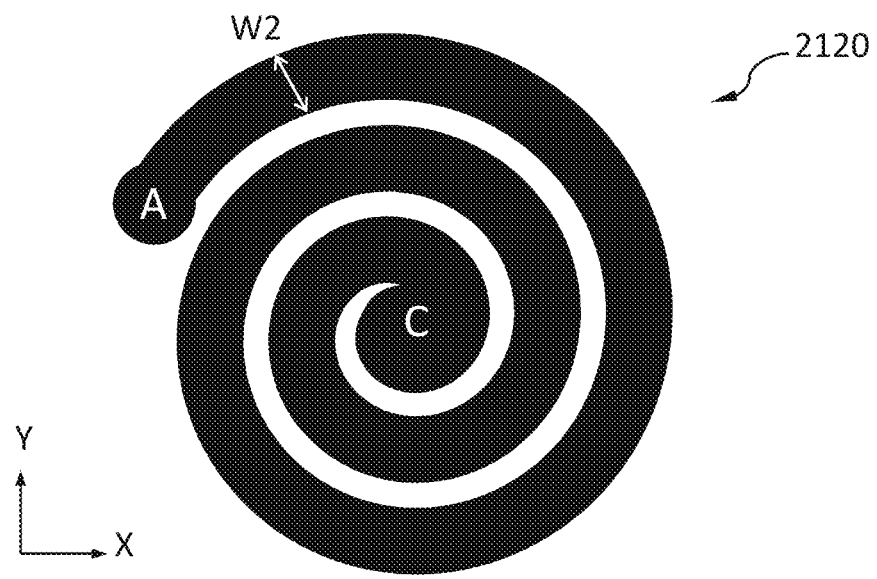
Figure 21C:
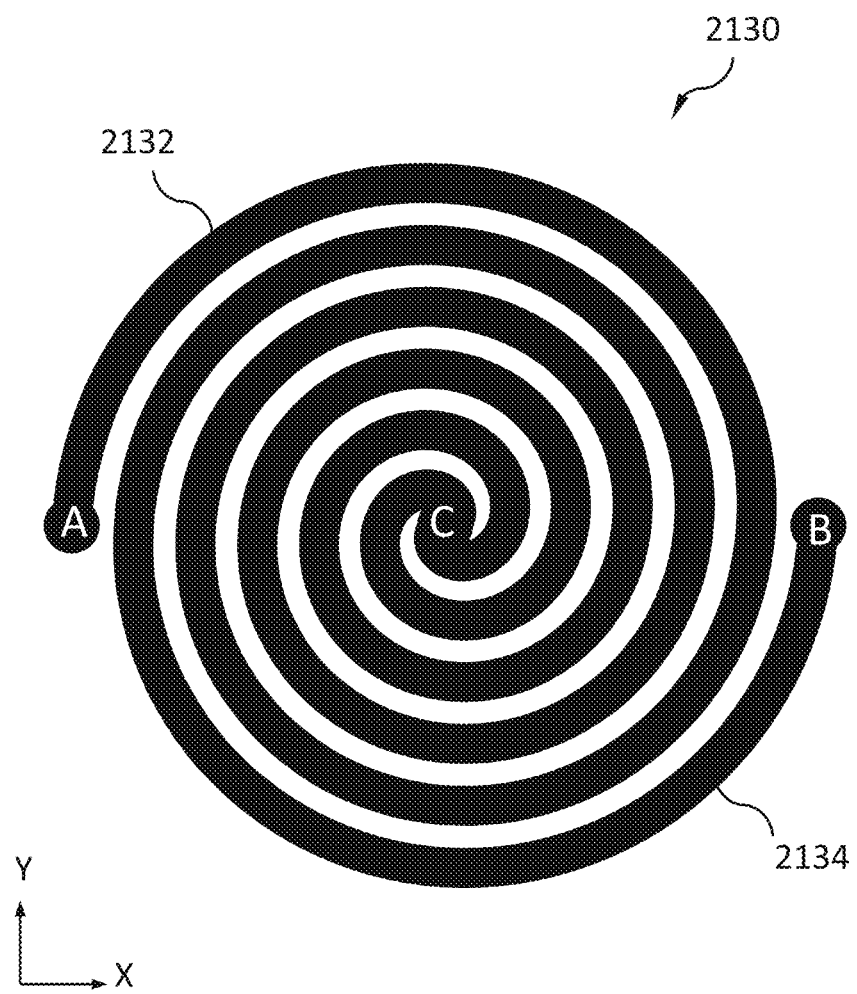

FIGS. 21A-21C show spiral heating element designs, in accordance with some embodiments. FIG. 21A shows a spiral resistive heating element 2110 having endpoints at location A at an outer end and location C in the center of the spiral, and having a width W1 of the spiral line. In FIG. 21B, resistive heating element 2120 is also spiral, but with a width W2 that is wider than width W1 of resistive heating element 2110. Because the width W2 is greater than W1, the electrical resistance of resistive heating element 2120 is less than the electrical resistance of resistive heating element 2110 (assuming the same material and the same thickness in the Z-direction of both resistive heating elements 2110 and 2120).

FIG. 21C shows a resistive heater 2130 with yet another spiral design, having a concentric Archimedean configuration. In FIG. 21C, resistive heater 2130 has two resistive heating elements 2132 and 2134 (i.e., individual resistors) that run in parallel to each other in a spiral pattern instead of one resistor forming the spiral as in FIGS. 21A and 21B. A first resistive heating element 2132 has endpoints at location A at an outer edge of the spiral and location C at the center, and a second resistive heating element 2134 has endpoints at location B at an outer edge and location C at the center. The parallel resistive heating elements 2132 and 2134 are interdigitated with each other in a concentric fashion. Endpoint locations A and B are shown to be diametrically opposite (180° apart) in this embodiment but may be positioned at other locations relative to each other in other embodiments (e.g., 0° apart, or 45°, or 90°). In some embodiments, three supports may be used to mechanically hold the structure via electrodes connected to locations A, B and C (electrode contact points). The two-resistor design of resistive heater 2130 may provide advantageous current flow and heater uniformity. As can be seen by FIGS. 21A-21C, the geometry and the number of resistors of the heater designs can be used to customize resistance properties, power requirements, and heating characteristics of the resistive heater.

Figure 21D:
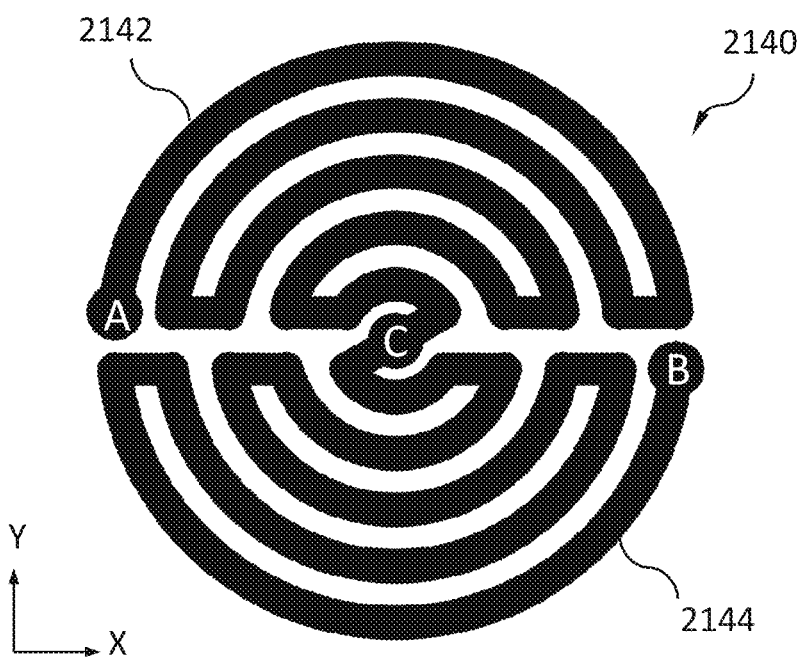
Figure 21E:
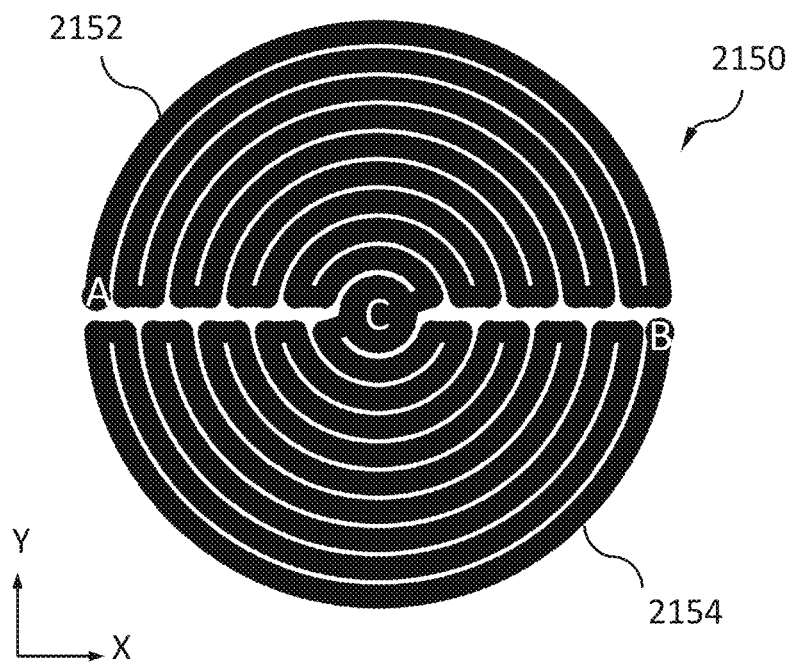

FIGS. 21D and 21E show a resistive heater 2140 and a resistive heater 2150, respectively, both demonstrating a serpentine pattern with two resistors. A first resistive heating element 2142 of resistive heater 2140 extends from endpoints A to C on one half of the circular area of the heating element. A second resistive heating element 2144 of resistive heater 2140 extends from endpoints B to C on the opposite half of the circular area. Similarly, resistive heater 2150 has a first resistive heating element 2152 from endpoints A to C and a second resistive heating element 2154 from endpoints B to C. In this embodiment, endpoints A and B are at locations at an outer edge of the circular area, and location C is at the center. The serpentine pattern of both resistors in each of the resistive heaters 2140 and 2150 follows a circumferential path, starting at an outer circumference of the circular area and then turning inward to traverse a concentric path in the opposite direction, and repeating this back-and-forth pattern until the central location C. Having resistors on opposite halves, rather than being interdigitated as in FIG. 21C, creates separate heating zones that can be controlled individually. The resistor pattern of resistive heater 2150 is denser than that of resistive heater 2140, covering more surface area of the circular area. That is, resistive heater 2150 has a greater number of concentric, serpentine paths than resistive heater 2140. In other embodiments, the width of the resistor lines can also be changed as described in the comparison of FIG. 21A and FIG. 21B, in addition to changing the density of the pattern. The geometric characteristics of the heater designs can be used to tailor the heating characteristics (e.g., current flow, electrical resistance, uniformity, zone heating) of the resistive heaters.

Figure 21F:
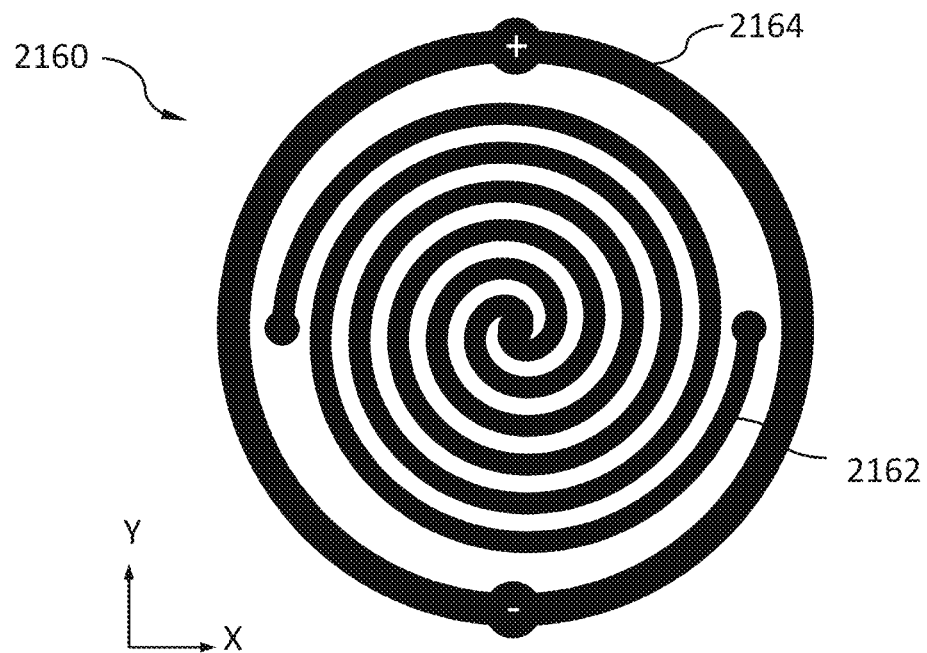
Figure 21G:
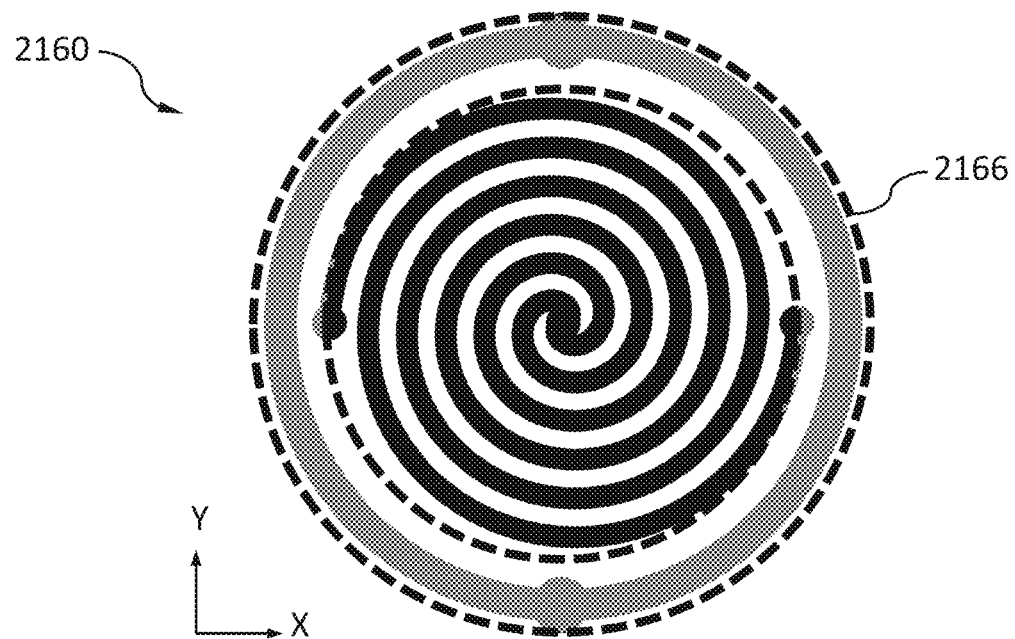

FIG. 21F shows a plan view of an embodiment of a resistive heater 2160 having an inner heating element 2162 (i.e., resistive heating element), which may be, for example any of the designs of FIGS. 21A-21E. Resistive heater 2160 also includes an outer heating element 2164 (i.e., resistive heating element) that surrounds the inner heating element 2162. The outer heating element 2164 has electrode connection points, indicated by a positive terminal ("+") and a negative terminal ("−"). The design of FIG. 21F can provide additional parameters for controlling temperature across the surface of the substrate being heated. In some embodiments, resistive heater 2160 can serve as a multi-zone heater as described in relation to FIG. 13. For example, as illustrated in FIG. 21G, the outer heating element 2164 may heat an outer annular zone 2166 (zone between the two concentric dashed-line circles) of the substrate.

In the heater designs of FIGS. 21A-21G, aspects such as the width of the heating element lines, the density of the patterns (e.g., spacing between resistor lines) and number of resistors may be varied to customize the heating characteristics of the overall heater. Although two resistive heating elements within a resistive heater have been illustrated, other numbers of resistors may be included such as two or more resistive heating elements. For example, three resistive heating elements may be spiralled in parallel using the design of FIG. 21C. In another example, four serpentine resistive heating elements may be arranged in separate quadrants, using the design of FIGS. 21D and 21E. In a further example, two concentric outer resistive heating elements may be utilized in the design of FIG. 21F to result in a three-zone heater as described in FIG. 13, where the two outer heating elements are annular heating zones, and the inner heating element is a central heating zone. In various embodiments, the individual resistive heating elements may be separately controlled.

Figure 22A:
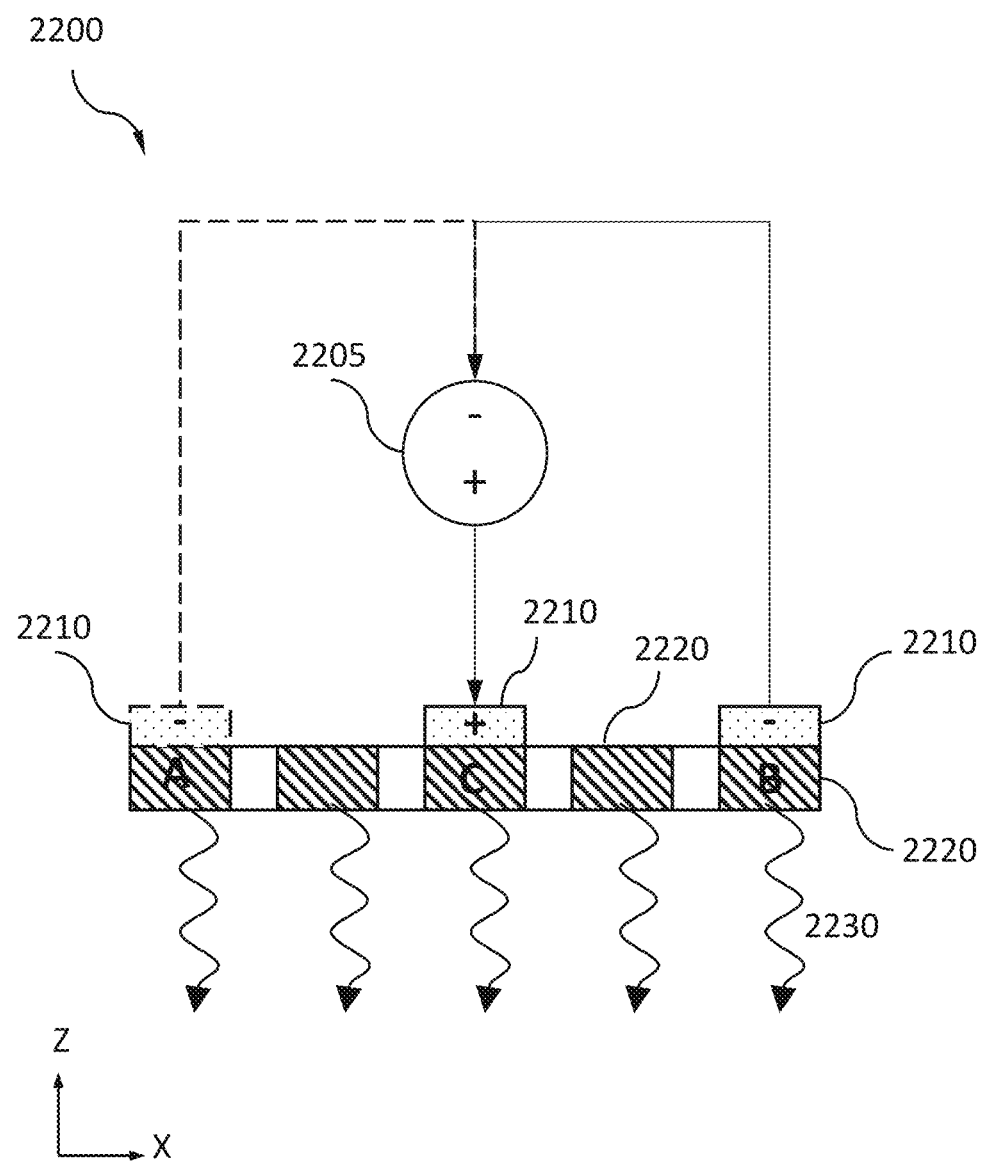
FIGS. 22A and 22B are side views of a resistive heater with a substrate holder assembly, in accordance with some embodiments.
Figure 22B:
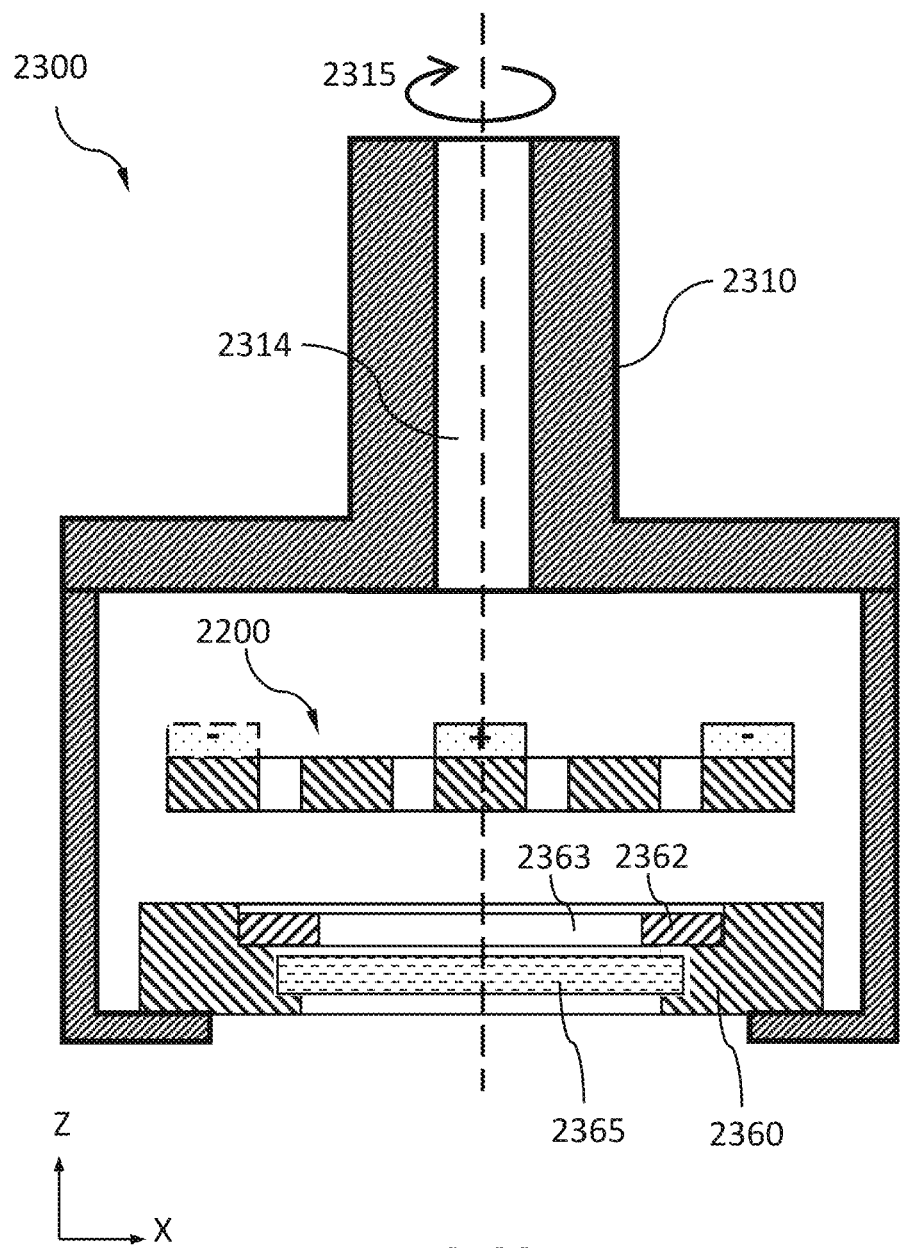

FIGS. 22A and 22B show side cross-sectional views of a resistive heater 2200, in accordance with some embodiments. FIG. 22A is schematic of the resistive heater 2200 with wiring connections, and FIG. 22B shows the resistive heater 2200 mounted into a rotatable platen assembly. These side views are denoted by an X-Z plane, relative to the X-Y plane of FIGS. 21A-21G. The resistive heater 2200 may be any of the embodiments described in relation to FIGS. 21A-21G and throughout this disclosure. In FIG. 22A, resistive heating elements 2220 have electrode feed points A, B and C as in FIGS. 21A-21E. Electrodes 2210 are coupled to the resistive heating elements 2220, with positive and negative terminals as shown in FIG. 22A. The electrodes are connected to a current or voltage source 2205, such as current/voltage source 605 of FIG. 6. When electric current is run through resistive heating elements 2220, due to current or voltage being supplied by current or voltage source 2205 via electrodes 2210, the resistive heating elements 2220 emit radiative heat 2230.

FIG. 22B shows the resistive heater 2200 mounted in a heating assembly 2300. A substrate holder 2360 (which may also be referred to as a platen) holds a substrate 2365 that is to be heated by resistive heater 2200. In this embodiment, substrate holder 2360 includes a backing ring 2362 that helps hold the substrate 2365 in place, where the backing ring 2362 has an open center 2363 that allows the substrate 2365 to be directly heated by the resistive heater 2200. The substrate holder 2360 sits on a platen holder assembly 2310 that rotates, as indicated by arrow 2315. Resistive heater 2200 is stationary, and electrical and mechanical connections to power and support the resistive heater 2200 feed through the center section 2314 of the platen holder assembly 2310. The whole assembly is connected to a magnetically coupled bearing for rotation of the platen holder assembly 2310 and consequently the substrate 2365.

As can be understood from this disclosure, resistive heaters are disclosed that emit radiative heat which can be absorbed by phonon absorption bands of wide bandgap substrates. Using the disclosed heaters, WBG substrates can be heated solely by radiative heating in high vacuum environments, without the need for a conductive material coating on the substrate. Materials, designs and methods of making the resistive heaters are disclosed, along with heating control systems and methods for use with the resistive heaters.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only and is not intended to limit the invention.

What is claimed is:

1. A method of heating a substrate in a vacuum deposition process, the method comprising:
   providing a resistive heater having a resistive heating element, wherein radiative heat emitted from the resistive heating element has a wavelength in a mid-infrared band from 5 µm to 40 µm that corresponds to a phonon absorption band of a substrate, wherein the substrate comprises a wide bandgap (WBG) semiconducting material and has an uncoated surface and a deposition surface opposite the uncoated surface;
   positioning the resistive heater and the substrate in a vacuum deposition chamber, wherein the uncoated surface of the substrate is spaced apart from and faces the resistive heater;
   operating the vacuum deposition chamber at a pressure less than or equal to $5 \times 10^{-4}$ Torr; and
   generating the radiative heat from the resistive heating element, wherein the uncoated surface of the substrate is directly heated by absorbing the radiative heat.

2. The method of claim 1, wherein the resistive heating element comprises SiC.

3. The method of claim 2, wherein the SiC is n-type doped.

4. The method of claim 1, wherein the resistive heating element comprises $Ga_2O_3$.

5. The method of claim 4, wherein the $Ga_2O_3$ is coated with SiC.

6. A method of depositing an epitaxial oxide on a substrate in a vacuum deposition process, the method comprising:
   positioning a resistive heater and a substrate in a vacuum deposition chamber, the resistive heater having a resistive heating element, wherein the substrate comprises a wide bandgap (WBG) semiconducting material and has an uncoated surface and a deposition surface opposite the uncoated surface, wherein the positioning comprises the uncoated surface being spaced apart from and facing the resistive heating element;
   operating the vacuum deposition chamber at a pressure less than or equal to $5 \times 10^{-4}$ Torr;
   generating radiative heat from the resistive heating element, wherein the radiative heat has a wavelength in a mid-infrared band of 5 µm to 40 µm that corresponds to a phonon absorption band of the substrate; and
   depositing an epitaxial oxide layer on the deposition surface of the substrate.

7. The method of claim 6, wherein the uncoated surface of the substrate is directly heated by absorbing the radiative heat.

8. The method of claim 1, wherein the resistive heating element is resistant to oxidation.

9. The method of claim 4, wherein the $Ga_2O_3$ is n-type doped.

10. The method of claim 6, wherein the resistive heating element is resistant to oxidation.

* * * * *